US012407347B2

(12) United States Patent
Wada et al.

(10) Patent No.: US 12,407,347 B2
(45) Date of Patent: Sep. 2, 2025

(54) GATE DRIVER, INSULATION MODULE, LOW-VOLTAGE CIRCUIT UNIT, AND HIGH-VOLTAGE CIRCUIT UNIT

(71) Applicant: ROHM CO., LTD., Kyoto (JP)

(72) Inventors: Keiji Wada, Kyoto (JP); Bungo Tanaka, Kyoto (JP); Kosei Osada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 77 days.

(21) Appl. No.: 18/226,293

(22) Filed: Jul. 26, 2023

(65) Prior Publication Data

US 2023/0370064 A1 Nov. 16, 2023

Related U.S. Application Data

(63) Continuation of application No. PCT/JP2022/002654, filed on Jan. 25, 2022.

(30) Foreign Application Priority Data

Feb. 3, 2021 (JP) ................................. 2021-015944

(51) Int. Cl.
*H03K 17/00* (2006.01)
*H01F 19/04* (2006.01)
*H03K 17/691* (2006.01)

(52) U.S. Cl.
CPC ........... *H03K 17/691* (2013.01); *H01F 19/04* (2013.01)

(58) Field of Classification Search
CPC .. H03K 17/691; H01F 2019/085; H01F 19/04
See application file for complete search history.

(56) References Cited

U.S. PATENT DOCUMENTS

| 10,320,448 | B2* | 6/2019 | Subramonian | H04B 5/79 |
| 10,917,139 | B2* | 2/2021 | Uo | H03H 7/09 |
| 2013/0055052 | A1 | 2/2013 | Kaeriyama | |
| 2013/0321094 | A1* | 12/2013 | Sumida | H01L 28/10 |
| | | | | 333/24.2 |
| 2014/0325322 | A1 | 10/2014 | Kaeriyama | |
| 2017/0154727 | A1* | 6/2017 | Spina | H01L 23/66 |
| 2021/0119590 | A1* | 4/2021 | Du | H03F 3/245 |

FOREIGN PATENT DOCUMENTS

| JP | H02-151261 A | 6/1990 |
| JP | 2013-051547 A | 3/2013 |
| JP | 2014-522561 A | 9/2014 |

OTHER PUBLICATIONS

International Search Report and Written Opinion mailed on Mar. 8, 2022, received for PCT Application PCT/JP2022/002654, filed on Jan. 25, 2022, 9 pages including English Translation.

* cited by examiner

*Primary Examiner* — Tuan T Lam
(74) *Attorney, Agent, or Firm* — XSENSUS LLP

(57) ABSTRACT

A gate driver includes a low-voltage circuit configured to be actuated by application of a first voltage and a high-voltage circuit configured to be actuated by application of a second voltage that is higher than the first voltage. The gate driver also includes a transformer and a capacitor connected in series to the transformer. The low-voltage circuit and the high-voltage circuit are connected by the transformer and the capacitor and configured to transmit a signal through the transformer and the capacitor.

13 Claims, 22 Drawing Sheets

GATE DRIVER, INSULATION MODULE, LOW-VOLTAGE CIRCUIT UNIT, AND HIGH-VOLTAGE CIRCUIT UNIT

CROSS-REFERENCE TO RELATED APPLICATIONS

This is a continuation application (CA) of PCT Application No. PCT/JP2022/002654, filed on Jan. 25, 2022, which claims priority to Japanese Patent Application No. 2021-015944, filed on Feb. 3, 2021, the entire contents of each of which are incorporated herein by reference.

BACKGROUND

1. Field

The present disclosure relates to a gate driver, an insulation module, a low-voltage circuit unit, and a high-voltage circuit unit.

2. Description of Related Art

An example of a gate driver that drives a switching element such as a transistor is an insulated gate driver, which is known in the art. Japanese Laid-Open Patent Publication No. 2013-51547 describes an example of a semiconductor integrated circuit that is used as an insulated gate driver including a transformer. The transformer includes a first coil at the primary side and a second coil at the secondary side.

DETAILED DESCRIPTION

Embodiments of a gate driver will be described below with reference to the drawings. The embodiments described below exemplify configurations and methods for embodying a technical concept and are not intended to limit the material, shape, structure, layout, dimensions, and the like of each component to those described below.

First Embodiment

Figure 1:
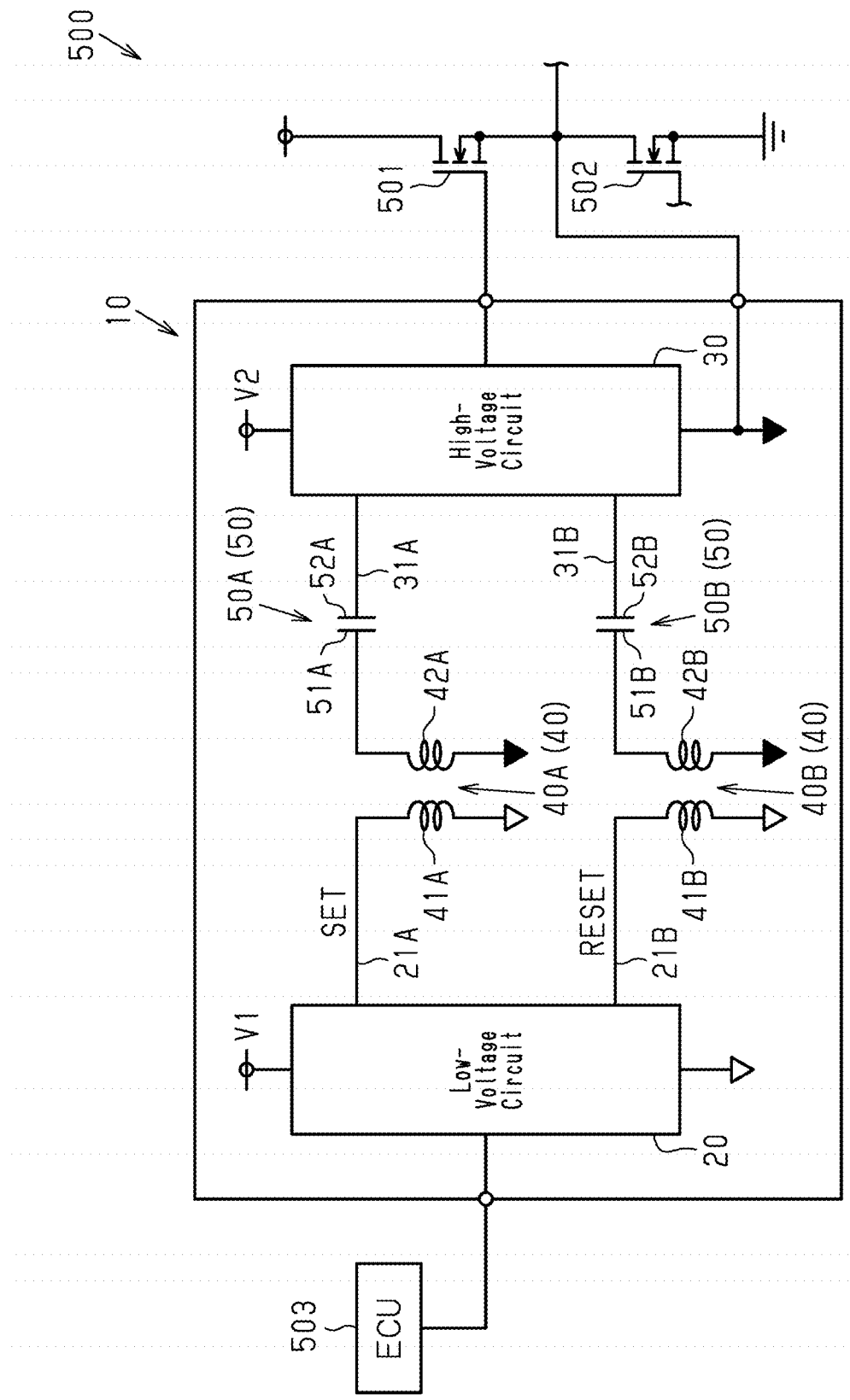
FIG. 1 is a schematic circuit diagram showing a first embodiment of a gate driver.

A first embodiment of a gate driver 10 will be described with reference to FIGS. 1 to 3. FIG. 1 schematically shows an example of a circuit configuration of the gate driver 10.

As shown in FIG. 1, the gate driver 10 is configured to apply a drive voltage signal to the gate of a switching element. In an example, the gate driver 10 is used in an inverter device 500 mounted on an electric vehicle or a hybrid electric vehicle. The inverter device 500 includes two switching elements 501 and 502 connected in series to each other, the gate driver 10, and an ECU 503 that controls the gate driver 10. In an example, the switching element 501 is a high-side switching element connected to a drive power supply. The switching element 502 is a low-side switching element. Examples of the switching elements 501 and 502 include transistors such as a Si MOSFET, a SiC MOSFET, and an IGBT. The gate driver 10 of the first embodiment applies a drive voltage signal to the gate of the switching element 501. In the description hereafter, MOSFETs are used in the switching elements 501 and 502.

The gate driver 10 is provided for each of the switching elements 501 and 502 and separately drives the switching elements 501 and 502. In the first embodiment, the gate driver 10 that drives the switching element 501 will be described for the sake of brevity.

The gate driver 10 includes a low-voltage circuit 20 to which a first voltage V1 is applied, a high-voltage circuit 30 to which a second voltage V2 is applied, a transformer 40, and a capacitor 50. The second voltage V2 is higher than the first voltage V1. The first voltage V1 and the second voltage V2 are direct current voltages.

The gate driver 10 of the first embodiment is configured, based on a control signal from the ECU 503, which is an external control device, to transmit a signal from the low-voltage circuit 20 to the high-voltage circuit 30 through the transformer 40 and the capacitor 50 and to output a drive voltage signal from the high-voltage circuit 30. The control signal from the ECU 503 corresponds to an external instruction.

The signal transmitted from the low-voltage circuit 20 toward the high-voltage circuit 30, that is, a signal output from the low-voltage circuit 20, is for driving, for example, the switching element 501. Examples of the signal include a set signal and a reset signal. The set signal transmits a rising edge of the control signal from the ECU 503. The reset signal transmits a falling edge of the control signal from the ECU 503. In other words, the set signal and the reset signal are used to generate a drive voltage signal for the switching element 501. The set signal and the reset signal correspond to a first signal.

More specifically, the low-voltage circuit 20 is actuated by application of the first voltage V1. The low-voltage circuit 20 is electrically connected to the ECU 503 and generates a set signal and a reset signal based on a control signal received from the ECU 503. In an example, the low-voltage circuit 20 generates the set signal in response to a rising edge of the control signal and generates the reset signal in response to a falling edge of the control signal. The low-voltage circuit 20 transmits the generated set signal and reset signal toward the high-voltage circuit 30.

The high-voltage circuit 30 is actuated by application of the second voltage V2. The high-voltage circuit 30 is electrically connected to the gate of the switching element 501. Based on the set signal and the reset signal received from the low-voltage circuit 20, the high-voltage circuit 30 generates a drive voltage signal for driving the switching element 501 and applies the drive voltage signal to the gate of the switching element 501. In other words, the high-voltage circuit 30 generates a drive voltage signal that is applied to the gate of the switching element 501 based on the first signal output from the low-voltage circuit 20. More specifically, the high-voltage circuit 30 generates a drive voltage signal for activating the switching element 501 based on the set signal and applies the drive voltage signal to the gate of the switching element 501. The high-voltage circuit 30 generates a drive voltage signal for deactivating the switching element 501 based on the reset signal and applies the drive voltage signal to the gate of the switching element 501. Thus, the gate driver 10 controls the activation and deactivation of the switching element 501.

The high-voltage circuit 30 includes, for example, an R-S flip-flop circuit, into which a set signal and a reset signal are input, and a driver unit. The driver unit generates a drive voltage signal based on an output signal of the R-S flip-flop circuit. However, the high-voltage circuit 30 may have any specific circuit configuration.

The transformer 40 and the capacitor 50 are disposed between the low-voltage circuit 20 and the high-voltage circuit 30. More specifically, the low-voltage circuit 20 and the high-voltage circuit 30 are electrically connected by the transformer 40 and the capacitor 50. In the first embodiment, the capacitor 50 is arranged between the transformer 40 and the high-voltage circuit 30 in the circuitry. The transformer 40 and the capacitor 50 are connected in series.

In the gate driver 10 of the first embodiment, the low-voltage circuit 20 and the high-voltage circuit 30 are insulated from each other by the transformer 40 and the capacitor 50. More specifically, the transformer 40 and the capacitor 50 restrict transmission of a direct current voltage between the low-voltage circuit 20 and the high-voltage circuit 30 while allowing transmission of various signals such as the set signal and the reset signal.

Thus, the state in which the low-voltage circuit 20 and the high-voltage circuit 30 are insulated from each other refers to a state in which transmission of a direct current voltage between the low-voltage circuit 20 and the high-voltage circuit 30 is interrupted, while transmission of a signal between the low-voltage circuit 20 and the high-voltage circuit 30 is allowed.

The insulation voltage of the gate driver 10 is, for example, greater than or equal to 2500 Vrms and less than or equal to 7500 Vrms. In the first embodiment, the insulation voltage of the gate driver 10 is approximately 3750 Vrms. However, the insulation voltage of the gate driver 10 is not limited to these values and may be any specific numerical value.

In the first embodiment, the insulation voltage of the transformer 40 is, for example, greater than or equal to 2500 Vrms and less than or equal to 7500 Vrms. The insulation voltage of the transformer 40 may be greater than or equal to 2500 Vrms and less than or equal to 5700 Vrms. However, the insulation voltage of the transformer 40 is not limited to these values and may be any value.

The insulation voltage of the capacitor 50 is set to be, for example, greater than or equal to the insulation voltage of the transformer 40. In an example, the insulation voltage of the capacitor 50 is greater than or equal to 200 Vrms and less than or equal to 5700 Vrms and is preferably greater than or equal to 600 Vrms and less than or equal to 5700 Vrms. The range of the insulation voltage of the capacitor 50 indicates that the insulation voltage of the capacitor 50 is not limited to being greater than or equal to the insulation voltage of the transformer 40 and may be less than the insulation voltage of the transformer 40.

In the first embodiment, the ground of the low-voltage circuit 20 and the ground of the high-voltage circuit 30 are independently arranged. In the description hereafter, the ground potential of the low-voltage circuit 20 is referred to as a first reference potential, and the ground potential of the high-voltage circuit 30 is referred to as a second reference potential. In this case, the first voltage V1 is a voltage from the first reference potential, and the second voltage V2 is a voltage from the second reference potential. The first voltage V1 is, for example, greater than or equal to 4.5 V and less than or equal to 5.5 V. The second voltage V2 is, for example, greater than or equal to 9 V and less than or equal to 24 V.

The transformer 40 and the capacitor 50 will now be described in detail.

The gate driver 10 of the first embodiment includes two transformers 40 and two capacitors 50 corresponding to the two types of signals transmitted from the low-voltage circuit 20 to the high-voltage circuit 30. More specifically, the gate driver 10 includes a transformer 40 and a capacitor 50 that are used to transmit a set signal and a transformer 40 and a capacitor 50 that are used to transmit a reset signal.

Hereinafter, for the sake of brevity, the transformer 40 and the capacitor 50 used to transmit a set signal are referred to as a transformer 40A and a capacitor 50A. The transformer 40 and the capacitor 50 used to transmit a reset signal are referred to as a transformer 40B and a capacitor 50B. In other words, the transformer 40 includes the transformer 40A and the transformer 40B. The capacitor 50 includes the capacitor 50A and the capacitor 50B.

The gate driver 10 includes a low-voltage signal line 21A, which connects the low-voltage circuit 20 and the transformer 40A, and a low-voltage signal line 21B, which connects the low-voltage circuit 20 and the transformer 40B. Thus, the set signal transmits through the low-voltage signal line 21A. The reset signal transmits through the low-voltage signal line 21B.

The gate driver 10 includes a high-voltage signal line 31A, which connects the transformer 40A and the high-voltage circuit 30, and a high-voltage signal line 31B, which connects the transformer 40B and the high-voltage circuit 30. Thus, the set signal transmits through the high-voltage signal line 31A. The reset signal transmits through the high-voltage signal line 31B.

In the first embodiment, the transformer 40A and the capacitor 50A are connected in series by the high-voltage signal line 31A. The capacitor 50A and the high-voltage circuit 30 are connected by the high-voltage signal line 31A. In other words, the transformer 40A and the high-voltage circuit 30 are electrically connected through the capacitor 50A. Also, the transformer 40B and the capacitor 50B are connected in series by the high-voltage signal line 31B. The capacitor 50B and the high-voltage circuit 30 are connected by the high-voltage signal line 31B. In other words, the transformer 40B and the high-voltage circuit 30 are electrically connected through the capacitor 50B.

The set signal output from the low-voltage circuit 20 is transmitted through the transformer 40A and the capacitor 50A to the high-voltage circuit 30. The reset signal output from the low-voltage circuit 20 is transmitted through the transformer 40B and the capacitor 50B to the high-voltage circuit 30.

The transformer 40A includes a first coil 41A and a second coil 42A that is insulated from and configured to be magnetically coupled to the first coil 41A.

The first coil 41A is connected to the low-voltage circuit 20 by the low-voltage signal line 21A and is also connected to the ground of the low-voltage circuit 20. More specifically, the first coil 41A includes a first end electrically connected to the low-voltage circuit 20 and a second end electrically connected to the ground of the low-voltage circuit 20. Thus, the potential of the second end of the first coil 41A equals the first reference potential. The first reference potential is, for example, 0 V.

The second coil 42A is connected to the high-voltage circuit 30 by the high-voltage signal line 31A and is also connected to the ground of the high-voltage circuit 30. More specifically, the second coil 42A includes a first end electrically connected to the high-voltage circuit 30 and a second end electrically connected to the ground of the high-voltage circuit 30. Thus, the potential of the second end of the second coil 42A equals the second reference potential.

The ground of the high-voltage circuit 30 is connected to the source of the switching element 501. Thus, the second reference potential fluctuates as the inverter device 500 is driven and may become, for example, greater than or equal to 600 V.

The capacitor 50A includes a first electrode 51A and a second electrode 52A that are insulated. The first electrode 51A is electrically connected to the transformer 40A. The second electrode 52A is electrically connected to the high-voltage circuit 30. More specifically, the first electrode 51A is connected to the second coil 42A by the high-voltage signal line 31A. The second electrode 52A is connected to the high-voltage circuit 30 by the high-voltage signal line 31A.

The transformer 40B includes a first coil 41B, which is electrically connected to the low-voltage circuit 20 by the low-voltage signal line 21B, and a second coil 42B, which is insulated from and configured to be magnetically coupled to the first coil 41B. The second coil 42B is electrically connected to the high-voltage circuit 30 through the capacitor 50B.

The capacitor 50B includes a first electrode 51B and a second electrode 52B that are insulated. The first electrode 51B is electrically connected to the transformer 40B. The second electrode 52B is electrically connected to the high-voltage circuit 30. The transformer 40B and the capacitor 50B are the same as the transformer 40A and the capacitor 50A and thus will not be described in detail.

The structure of the gate driver 10 will now be described with reference to FIGS. 2 and 3. FIG. 2 shows an example of a plan view showing the internal structure of the gate driver 10. FIG. 3 shows a cross-sectional view taken along line 3-3 in FIG. 2.

Figure 2:
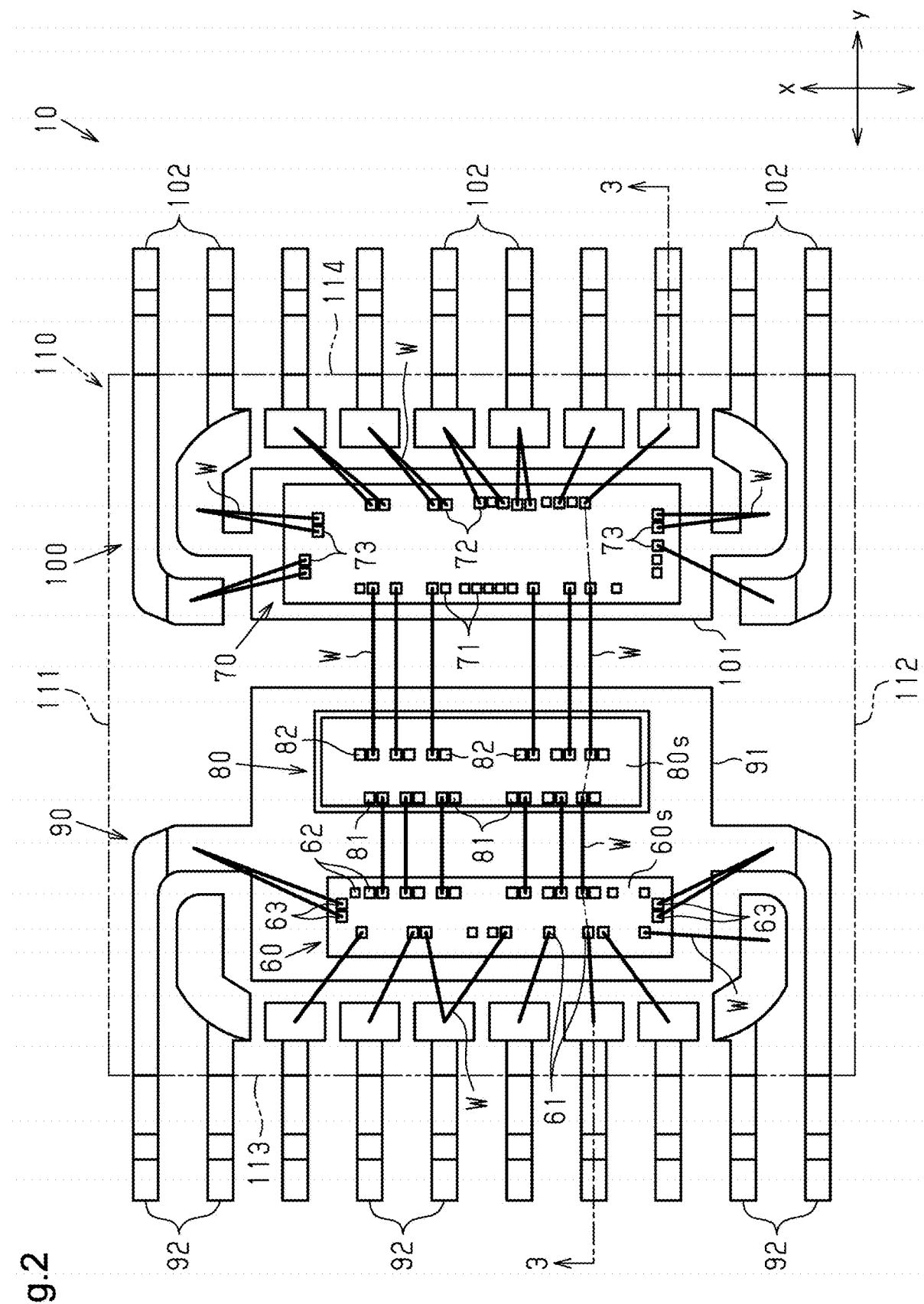
FIG. 2 is a plan view showing an internal structure of the gate driver of the first embodiment.

Since FIG. 1 shows a simplified circuit configuration of the gate driver 10, the number of external terminals of the gate driver 10 shown in FIG. 2 is greater than the number of external terminals of the gate driver 10 shown in FIG. 1. The number of external terminals of the gate driver 10 is the number of external electrodes configured to connect the gate driver 10 to electronic components arranged outside the gate driver 10, such as the ECU 503 and the switching element 501 (refer to FIG. 1). The number of signal lines (the number of wires W described later) that transmits a signal from the low-voltage circuit 20 to the high-voltage circuit 30 in the gate driver 10 shown in FIG. 2 is greater than the number of signal lines in the gate driver 10 shown in FIG. 1.

As shown in FIG. 2, the gate driver 10 is a semiconductor device including a plurality of semiconductor chips arranged in a single package and is, for example, mounted on a circuit substrate disposed in the inverter device 500. Each of the switching elements 501 and 502 is mounted on a mount substrate that differs from the circuit substrate. A cooling unit is attached to the mount substrate.

The package type of the gate driver 10 is small outline (SO) and is a small outline package (SOP) in the first embodiment. The gate driver 10 includes a low-voltage circuit chip 60, a high-voltage circuit chip 70, and a transformer chip 80, which are semiconductor chips, a low-voltage lead frame 90 on which the low-voltage circuit chip 60 is mounted, a high-voltage lead frame 100 on which the high-voltage circuit chip 70 is mounted, and an encapsulation resin 110 that encapsulates the chips 60, 70, 80 and a part of the lead frames 90 and 100. In FIG. 2, the encapsulation resin 110 is indicated by double-dashed lines to illustrate the internal structure of the gate driver 10. The package type of the gate driver 10 may be changed in any manner.

The encapsulation resin 110 is formed from an electrically-insulative material and is formed from, for example, a black epoxy resin. The encapsulation resin 110 has the form of a rectangular plate having a thickness-wise direction conforming to the z-direction. The encapsulation resin 110 includes four resin side surfaces 111 to 114. More specifically, the encapsulation resin 110 includes two end surfaces in the x-direction, namely, the resin side surfaces 111 and 112, and two end surfaces in the y-direction, namely, the resin side surfaces 113 and 114. The x-direction and the y-direction are orthogonal to the z-direction. The x-direction and the y-direction are orthogonal to each other. In the description hereafter, a plan view means a view from the z-direction.

The low-voltage lead frame 90 and the high-voltage lead frame 100 are formed from a conductor and, in the first embodiment, are formed from copper (Cu). The lead frames 90 and 100 are disposed to extend from the inside to the outside of the encapsulation resin 110.

The low-voltage lead frame 90 includes a low-voltage die pad 91 disposed in the encapsulation resin 110 and low-voltage leads 92 disposed to extend from the inside to the outside of the encapsulation resin 110. Each low-voltage lead 92 includes an external terminal configured to be electrically connected to an external electronic device such as the ECU 503 (refer to FIG. 1).

The low-voltage circuit chip 60 and the transformer chip 80 are mounted on the low-voltage die pad 91. In plan view, the low-voltage die pad 91 is disposed so that the center of the low-voltage die pad 91 in the y-direction is located closer to the resin side surface 113 than the center of the encapsulation resin 110 in the y-direction. In the first embodiment, the low-voltage die pad 91 is not exposed from the encapsulation resin 110. In plan view, the low-voltage die pad 91 is rectangular so that the long sides extend in the x-direction and the short sides extend in the y-direction.

The low-voltage leads 92 are spaced apart from each other in the x-direction. Among the low-voltage leads 92, the low-voltage leads 92 located at opposite ends in the x-direction are integrated with the low-voltage die pad 91. Each low-voltage lead 92 partially projects from the resin side surface 113 toward the outside of the encapsulation resin 110.

The high-voltage lead frame 100 includes a high-voltage die pad 101 disposed in the encapsulation resin 110 and high-voltage leads 102 disposed to extend from the inside to the outside of the encapsulation resin 110. Each high-voltage lead 102 includes an external terminal configured to be electrically connected to an external electronic device such as the gate of the switching element 501 (refer to FIG. 1).

The high-voltage circuit chip 70 is mounted on the high-voltage die pad 101. In plan view, the high-voltage die pad 101 is disposed closer to the resin side surface 114 than the low-voltage die pad 91 in the y-direction. In the first embodiment, the high-voltage die pad 101 is not exposed from the encapsulation resin 110. In plan view, the high-voltage die pad 101 is rectangular so that the long sides extend in the x-direction and the short sides extend in the y-direction.

The low-voltage die pad 91 and the high-voltage die pad 101 are spaced apart from each other in the y-direction. The y-direction may also be referred to as the arrangement direction of the two die pads 91 and 101.

The dimensions of the low-voltage die pad 91 and the high-voltage die pad 101 in the y-direction are set in accordance with the size and the number of semiconductor chips that are mounted. In the first embodiment, the low-voltage circuit chip 60 and the transformer chip 80 are mounted on the low-voltage die pad 91, and the high-voltage circuit chip 70 is mounted on the high-voltage die pad 101. Hence, the low-voltage die pad 91 is greater than the high-voltage die pad 101 in dimension in the y-direction.

The high-voltage leads 102 are spaced apart from each other in the x-direction. Among the high-voltage leads 102, two of the high-voltage leads 102 are integrated with the high-voltage die pad 101. Each high-voltage lead 102 partially projects from the resin side surface 114 toward the outside of the encapsulation resin 110.

In the first embodiment, the number of the high-voltage leads 102 is the same as the number of the low-voltage leads 92. As shown in FIG. 2, the low-voltage leads 92 and the high-voltage leads 102 are arranged in a direction (x-direction) orthogonal to the arrangement direction (y-direction) of the low-voltage die pad 91 and the high-voltage die pad 101. The number of the high-voltage leads 102 and the number of the low-voltage leads 92 may be changed in any manner.

In the first embodiment, the low-voltage die pad 91 is supported by the two low-voltage leads 92 integrated with the low-voltage die pad 91, and the high-voltage die pad 101 is supported by the two high-voltage leads 102 integrated with the high-voltage die pad 101. Thus, the die pads 91 and 101 do not include suspension leads exposed from the resin side surfaces 111 and 112. This increases the creepage distance between the low-voltage lead frame 90 and the high-voltage lead frame 100.

The low-voltage circuit chip 60, the high-voltage circuit chip 70, and the transformer chip 80 are spaced apart from each other in the y-direction. In other words, in plan view, the low-voltage circuit chip 60, the high-voltage circuit chip 70, and the transformer chip 80 are spaced apart from each other in the arrangement direction of the die pads 91 and 101. In the first embodiment, the low-voltage circuit chip 60, the transformer chip 80, and the high-voltage circuit chip 70 are arranged in this order from the resin side surface 113 toward the resin side surface 114 in the y-direction.

Since the leads 92 and 102 are arranged in the x-direction, the x-direction may also be referred to as the arrangement direction of the leads 92 and 102. The y-direction may also be referred to as a direction orthogonal to the arrangement direction of the leads 92 and 102 in plan view. Thus, in other words, the low-voltage circuit chip 60, the high-voltage circuit chip 70, and the transformer chip 80 are spaced apart from each other in the direction orthogonal to the arrangement direction of the leads 92 and 102 in plan view. In plan view, the low-voltage circuit chip 60, the transformer chip 80, and the high-voltage circuit chip 70 are arranged in this order from the low-voltage leads 92 toward the high-voltage leads 102.

The low-voltage circuit chip 60 includes the low-voltage circuit 20 shown in FIG. 1. In plan view, the low-voltage circuit chip 60 is rectangular and has short sides and long sides. In plan view, the low-voltage circuit chip 60 is mounted on the low-voltage die pad 91 such that the long sides extend in the x-direction and the short sides extend in the y-direction. As shown in FIG. 3, the low-voltage circuit chip 60 includes a chip main surface 60s and a chip back surface 60r facing in opposite directions in the z-direction. The chip back surface 60r of the low-voltage circuit chip 60 is bonded to the low-voltage die pad 91 by a conductive bonding material SD such as solder or silver (Ag) paste.

As shown in FIG. 2, first electrode pads 61, second electrode pads 62, and third electrode pads 63 are formed on the chip main surface 60s of the low-voltage circuit chip 60. The electrode pads 61 to 63 are electrically connected to the low-voltage circuit 20 shown in FIG. 1.

The first electrode pads 61 disposed on the chip main surface 60s are located toward the low-voltage leads 92 from the center, in the y-direction, of the chip main surface 60s. The first electrode pads 61 are arranged in the x-direction. The second electrode pads 62 are disposed on one of the opposite ends of the chip main surface 60s in the y-direction located closer to the transformer chip 80. The second electrode pads 62 are arranged in the x-direction. The third electrode pads 63 are disposed on opposite ends of the chip main surface 60s in the x-direction.

The transformer chip 80 includes the transformer 40 shown in FIG. 1. In plan view, the transformer chip 80 is rectangular and has short sides and long sides. In the first embodiment, in plan view, the transformer chip 80 is mounted on the low-voltage die pad 91 such that the long sides extend in the x-direction and the short sides extend in the y-direction.

The transformer chip 80 is disposed adjacent to the low-voltage circuit chip 60 in the y-direction. The transformer chip 80 is disposed closer to the high-voltage circuit chip 70 than the low-voltage circuit chip 60.

Figure 3:
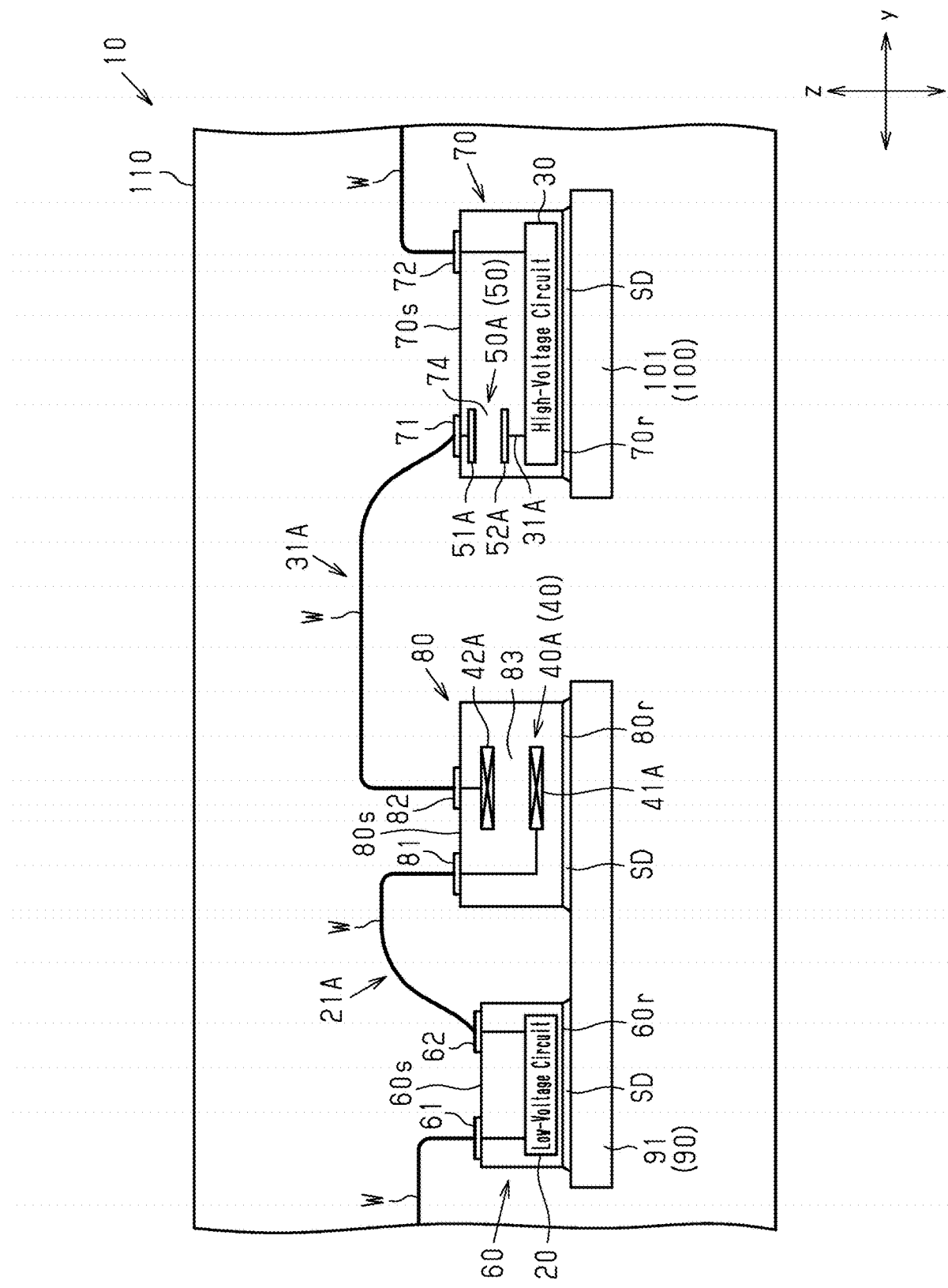
FIG. 3 is a schematic cross-sectional view showing a part of the cross-sectional structure taken along line 3-3 in FIG. 2.

As shown in FIG. 3, the transformer chip 80 includes a chip main surface 80s and a chip back surface 80r facing in opposite directions in the z-direction. The chip back surface 80r of the transformer chip 80 is bonded to the low-voltage die pad 91 by the conductive bonding material SD.

As shown in FIG. 2, first electrode pads 81 and second electrode pads 82 are formed on the chip main surface 80s of the transformer chip 80. The first electrode pads 81 are disposed, for example, on one of the opposite ends of the chip main surface 80s in the y-direction located closer to the low-voltage circuit chip 60. The first electrode pads 81 are arranged in the x-direction. The second electrode pads 82 are disposed near the center of the chip main surface 80s in the y-direction. The second electrode pads 82 are arranged in the x-direction.

The lead frames 90 and 100 are located closest to each other at the low-voltage die pad 91 and the high-voltage die pad 101. Hence, the low-voltage die pad 91 and the high-voltage die pad 101 need to be separated from each other by a predetermined distance or more so that the insulation voltage of the gate driver 10 is set to a predetermined insulation voltage. Hence, in plan view, the distance between the high-voltage circuit chip 70 and the transformer chip 80 is greater than the distance between the low-voltage circuit chip 60 and the transformer chip 80.

As shown in FIG. 3, the transformer chip 80 includes the transformers 40A and 40B (refer to FIG. 1). More specifically, the transformers 40A and 40B are integrated into one chip. The transformer chip 80 includes an insulation layer 83. The two coils 41A and 42A of the transformer 40A are embedded in the insulation layer 83 and are spaced apart and opposed to each other in the z-direction with the insulation layer 83 interposed therebetween. The insulation layer 83 may be a single layer or multiple layers.

Each of the coils 41A and 42A is formed of a conductive layer embedded in the insulation layer 83. In the first embodiment, the second coil 42A is disposed farther from the low-voltage die pad 91 than the first coil 41A.

The first coil 41A is electrically connected to the first electrode pad 81. The second coil 42A is electrically connected to the second electrode pad 82. The positional relationship between the two coils 41A and 42A may be changed in any manner.

Although not shown, the transformer 40B and the transformer 40A have the same structure. Thus, the first coil 41B of the transformer 40B is electrically connected to a first electrode pad 81 that differs from the first electrode pad 81 electrically connected to the first coil 41A. The second coil 42B is electrically connected to a second electrode pad 82 that differs from the second electrode pad 82 electrically connected to the second coil 42A.

The high-voltage circuit chip 70 includes the high-voltage circuit 30. As shown in FIG. 2, in plan view, the high-voltage circuit chip 70 is rectangular and has short sides and long sides. In plan view, the high-voltage circuit chip 70 is mounted on the high-voltage die pad 101 such that the long sides extend in the x-direction and the short sides extend in the y-direction. As shown in FIG. 3, the high-voltage circuit chip 70 includes a chip main surface 70s and a chip back surface 70r facing in opposite directions in the z-direction. The chip back surface 70r of the high-voltage circuit chip 70 is bonded to the high-voltage die pad 101 by the conductive bonding material SD.

As shown in FIG. 3, the capacitors 50A and 50B (refer to FIG. 1) of the first embodiment are incorporated in the high-voltage circuit chip 70. More specifically, the high-voltage circuit chip 70 includes an insulation layer 74. The capacitors 50A and 50B are embedded in the insulation layer 74. In the first embodiment, the insulation layer 74 is formed from a dielectric material. The insulation layer 74 is formed from, for example, Sift.

The high-voltage circuit 30 is disposed closer to the chip back surface 70r of the high-voltage circuit chip 70 than the insulation layer 74. In the first embodiment, the capacitor 50A is disposed in a portion of the high-voltage circuit chip 70 located close to the transformer chip 80 in the y-direction.

In the first embodiment, as shown in FIG. 3, the capacitor 50A located toward the chip main surface 70s from the high-voltage circuit 30 in the high-voltage circuit chip 70. In plan view, the capacitor 50A is disposed to overlap the high-voltage circuit 30. The position of the capacitor 50A disposed in the high-voltage circuit chip 70 may be changed in any manner.

The first electrode 51A and the second electrode 52A of the capacitor 50A have the form of flat plates opposed in a direction orthogonal to the z-direction. The first electrode MA and the second electrode 52A are spaced apart and opposed to each other in the z-direction with the insulation layer 74 disposed therebetween. The insulation layer 74 is disposed between the first electrode 51A and the second electrode 52A in the high-voltage circuit chip 70. In the first embodiment, the first electrode 51A is disposed closer to the chip main surface 70s than the second electrode 52A. Although not shown, the layout of the capacitor 50B in the high-voltage circuit chip 70 is the same as that of the capacitor 50A. Thus, the second electrodes 52A and 52B of the capacitors 50A and 50B are electrically connected to the high-voltage circuit 30 in the high-voltage circuit chip 70. That is, the capacitors 50A and 50B are electrically connected to the high-voltage circuit 30 in the high-voltage circuit chip 70.

As shown in FIG. 2, first electrode pads 71, second electrode pads 72, and third electrode pads 73 are formed on the chip main surface 70s of the high-voltage circuit chip 70. The first electrode pads 71 are disposed on one of the opposite ends of the chip main surface 70s in the y-direction located closer to the transformer chip 80. The first electrode pads 71 are arranged in the x-direction. The second electrode pads 72 are disposed on one of the opposite ends of the chip main surface 70s in the y-direction located farther from the transformer chip 80. The second electrode pads 72 are arranged in the x-direction. The third electrode pads 73 are disposed on opposite ends of the chip main surface 70s in the x-direction.

The first electrode pads 71 are electrically connected to the capacitors 50A and 50B (refer to FIG. 1). More specifically, some of the first electrode pads 71 are electrically connected to the first electrode 51A (refer to FIG. 1) of the capacitors 50A. Others of the first electrode pads 71 are electrically connected to the first electrode MB (refer to FIG. 1) of the capacitor 50B. The second electrode pads 72 and the third electrode pads 73 are electrically connected to the high-voltage circuit 30 (refer to FIG. 1).

Wires W are connected to each of the low-voltage circuit chip 60, the transformer chip 80, and the high-voltage circuit chip 70. Each of the wires W is a bonding wire formed with a wire bonder from a conductor such as gold (Au), aluminum (Al), or Cu.

The low-voltage circuit chip 60 is electrically connected to the low-voltage lead frame 90 by the wires W. More specifically, the first electrode pads 61 of the low-voltage circuit chip 60 are connected to the low-voltage leads 92 by the wires W. The third electrode pads 63 of the low-voltage circuit chip 60 are connected by the wires W to the two of the low-voltage leads 92 integrated with the low-voltage die pad 91. Thus, the low-voltage circuit 20 (refer to FIG. 1) is electrically connected to the low-voltage leads 92 (external electrodes of the gate driver 10 that are electrically connected to the ECU 503). In the first embodiment, the two low-voltage leads 92 integrated with the low-voltage die pad 91 include a ground terminal, and the wires W electrically connect the low-voltage circuit 20 to the low-voltage die pad 91. Thus, the low-voltage die pad 91 has the same potential as the ground of the low-voltage circuit 20.

The low-voltage circuit chip 60 and the transformer chip 80 are electrically connected by the wires W. More specifically, the second electrode pads 62 of the low-voltage circuit chip 60 and the first electrode pads 81 of the transformer chip 80 are connected by the wires W. Thus, the low-voltage circuit 20 is electrically connected to the first coils 41A and 41B of the transformers 40A and 40B (refer to FIG. 1).

The first coils 41A and 41B are electrically connected to the low-voltage die pad 91 by the first electrode pads 81, the wires W connecting the transformer chip 80 to the low-voltage circuit chip 60, the second electrode pads 62, the low-voltage circuit 20, the third electrode pads 63, and the wires W connected to the third electrode pads 63. Thus, the first coils 41A and 41B of the transformers 40A and 40B are electrically connected to the ground of the low-voltage circuit 20.

The transformer chip 80 and the high-voltage circuit chip 70 are electrically connected by the wires W. More specifically, the second electrode pads 82 of the transformer chip 80 and the first electrode pads 71 of the high-voltage circuit chip 70 are connected by the wires W. Thus, the second coil 42A of the transformer 40A is electrically connected to the first electrode 51A of the capacitor 50A (refer to FIG. 1), and the second coil 42B of the transformer 40B is electrically connected to the first electrode 51B of the capacitor 50B (refer to FIG. 1).

In the first embodiment, the second electrode 52A of the capacitor 50A is electrically connected to the high-voltage circuit 30 in the high-voltage circuit chip 70. Thus, the high-voltage circuit chip 70 incorporates a portion of the high-voltage signal line 31A that connects the second electrode 52A and the high-voltage circuit 30. The same applies to the high-voltage signal line 31B.

The high-voltage circuit chip 70 and the high-voltage leads 102 of the high-voltage lead frame 100 are electrically connected by wires W. More specifically, the second electrode pads 72 and the third electrode pads 73 of the high-voltage circuit chip 70 are connected to the high-voltage leads 102 by the wires W. Thus, the high-voltage circuit 30 is electrically connected to the high-voltage leads 102 (external electrodes of the gate driver 10 that are electrically connected to the inverter device 500 such as the switching element 501). In the first embodiment, the two high-voltage leads 102 integrated with the high-voltage die pad 101 include ground terminals, and the wires W electrically connect the high-voltage circuit 30 and the high-voltage die pad 101. Thus, the high-voltage die pad 101 has the same potential as the ground of the high-voltage circuit 30.

The second coils 42A and 42B (refer to FIG. 1) of the transformers 40A and 40B are electrically connected to the ground of the high-voltage circuit 30. More specifically, the coils 42A and 42B are electrically connected to the high-voltage die pad 101 by the second electrode pads 82, the wires W connecting the transformer chip 80 to the high-voltage circuit chip 70, the first electrode pads 71, the high-voltage circuit 30, the third electrode pads 73, and the wires W that are connected to the third electrode pads 73 and to the high-voltage leads 102 integrated with the high-voltage die pad 101.

The operation of the gate driver 10 according to the first embodiment will now be described.

In the gate driver 10 of the first embodiment, the ground potential of the high-voltage circuit 30 may become higher than the ground potential of the low-voltage circuit 20. In this case, a current may flow from the ground of the high-voltage circuit 30 toward the ground of the low-voltage circuit 20. The transformer 40 having an insulation structure is disposed between the low-voltage circuit 20 and the high-voltage circuit 30 to inhibit the current flowing from the high-voltage circuit 30 to the low-voltage circuit 20.

When a voltage higher than the insulation voltage of the transformer 40 is applied, dielectric breakdown, which is an anomaly in the first coil 41A (41B) and the second coil 42A (42B) forming a short circuit, may occur. In this case, even when dielectric breakdown occurs in the transformer 40 due to a short circuit of the first coil 41A (41B) and the second coil 42A (42B), insulation between the low-voltage circuit 20 and the high-voltage circuit 30 will be maintained by the capacitor 50, which is connected in series to the transformer 40. That is, the capacitor 50 is an additional insulation to the transformer 40, which is a base insulation.

The gate driver 10 of the first embodiment obtains the following advantages.

(1-1) The gate driver 10 includes the low-voltage circuit 20 to which the first voltage V1 is applied, the high-voltage circuit 30 to which the second voltage V1 higher than the first voltage V2 is applied, the transformer 40 including the first coils 41A and 41B and the second coils 42A and 42B opposed to each other with the insulation layer 83 interposed therebetween, and the capacitor 50 connected in series to the transformer 40. The low-voltage circuit 20 and the high-voltage circuit 30 transmit signals through the transformer 40 and the capacitor 50.

With this structure, the low-voltage circuit 20 and the high-voltage circuit 30 are insulated by the transformer 40 and the capacitor 50, which is connected in series to the transformer 40. Thus, even when dielectric breakdown occurs in the transformer 40 due to a short circuit between the first coil 41A (41B) and the second coil 42A (42B), the capacitor 50 maintains the insulation between the low-voltage circuit 20 and the high-voltage circuit 30. This improves safety.

(1-2) The capacitor 50A includes the first electrode 51A and the second electrode 52A. The first electrode 51A is electrically connected to the transformer 40A, and the second electrode 52A is electrically connected to the high-voltage circuit 30. The capacitor 50B includes the first electrode 51B and the second electrode 52B. The first electrode 51B is electrically connected to the transformer 40B, and the second electrode 52B is electrically connected to the high-voltage circuit 30. With this structure, when a dielectric breakdown occurs in the transformer 40A due to a short circuit between the first coil 41A and the second coil 42A, the capacitor 50A insulates the side toward the high-voltage circuit 30 from the transformer 40A. When a dielectric breakdown occurs in the transformer 40B due to a short circuit between the first coil 41B and the second coil 42B, the capacitor 50B insulates the side toward the high-voltage circuit 30 from the transformer 40B. This, for example, inhibits application of a high voltage, such as the drain voltage of the switching element 501, to the low-voltage lead frame 90 caused by the dielectric breakdown of the transformers 40A and 40B.

(1-3) The gate driver 10 includes the low-voltage circuit chip 60 including the low-voltage circuit 20, the high-voltage circuit chip 70 including the high-voltage circuit 30, and the transformer chip 80 including the transformers 40A and 40B. With this structure, the transformer chip 80 is disposed separately from the low-voltage circuit chip 60 and the high-voltage circuit chip 70. This allows the low-voltage circuit chip 60 and the high-voltage circuit chips 70 to use the common transformer chip 80. This reduces the costs for manufacturing different types of gate drivers that differ in at least one of the low-voltage circuit chip 60 and the high-voltage circuit chip 70.

(1-4) The capacitors 50A and 50B are incorporated in the high-voltage circuit chip 70. With this structure, the number of chips in the gate driver 10 is reduced as compared with a structure in which the capacitors 50A and 50B are separate chips. This allows enlargement of the gate driver 10 to be limited.

In addition, since the high-voltage circuit chip 70 is mounted on the high-voltage die pad 101, even when dielectric breakdown occurs in the transformer 40 due to a short circuit between the first coil 41A (41B) and the second coil 42A (42B), the high voltage is less likely to reach the low-voltage lead frame 90. Thus, application of the high voltage to the low-voltage lead frame 90 is limited.

(1-5) In the high-voltage circuit chip 70, the capacitors 50A and 50B are disposed to overlap the high-voltage circuit 30 in plan view. This structure allows enlargement of the high-voltage circuit chip 70 to be limited.

(1-6) The capacitors 50A and 50B are disposed in the high-voltage circuit chip 70 near the transformer chip 80. This structure shortens a conductive path between the transformer 40A and the capacitor 50A and a conductive path between the transformer 40B and the capacitor 50B. As a result, inductance caused by the length of the conductive paths is reduced.

(1-7) The transformer chip 80 is disposed between the low-voltage circuit chip 60 and the high-voltage circuit chip 70. With this structure, when adjacent ones of the chips 60, 70, and 80 in the arrangement direction (y-direction) of the chips 60, 70, and 80 are electrically connected to each other by wires W, the wires W do not need to extend over a predetermined chip. Thus, the connection structure of the wires W is simplified.

(1-8) The insulation voltage of the capacitor 50 is set to be greater than or equal to the insulation voltage of the transformer 40. With this structure, even when dielectric breakdown occurs in the transformer 40 due to a short circuit between the first coil 41A (41B) and the second coil 42A (42B), insulation between the low-voltage circuit 20 and the high-voltage circuit 30 is maintained without stopping the driving of the inverter device 500.

Second Embodiment

Figure 4:
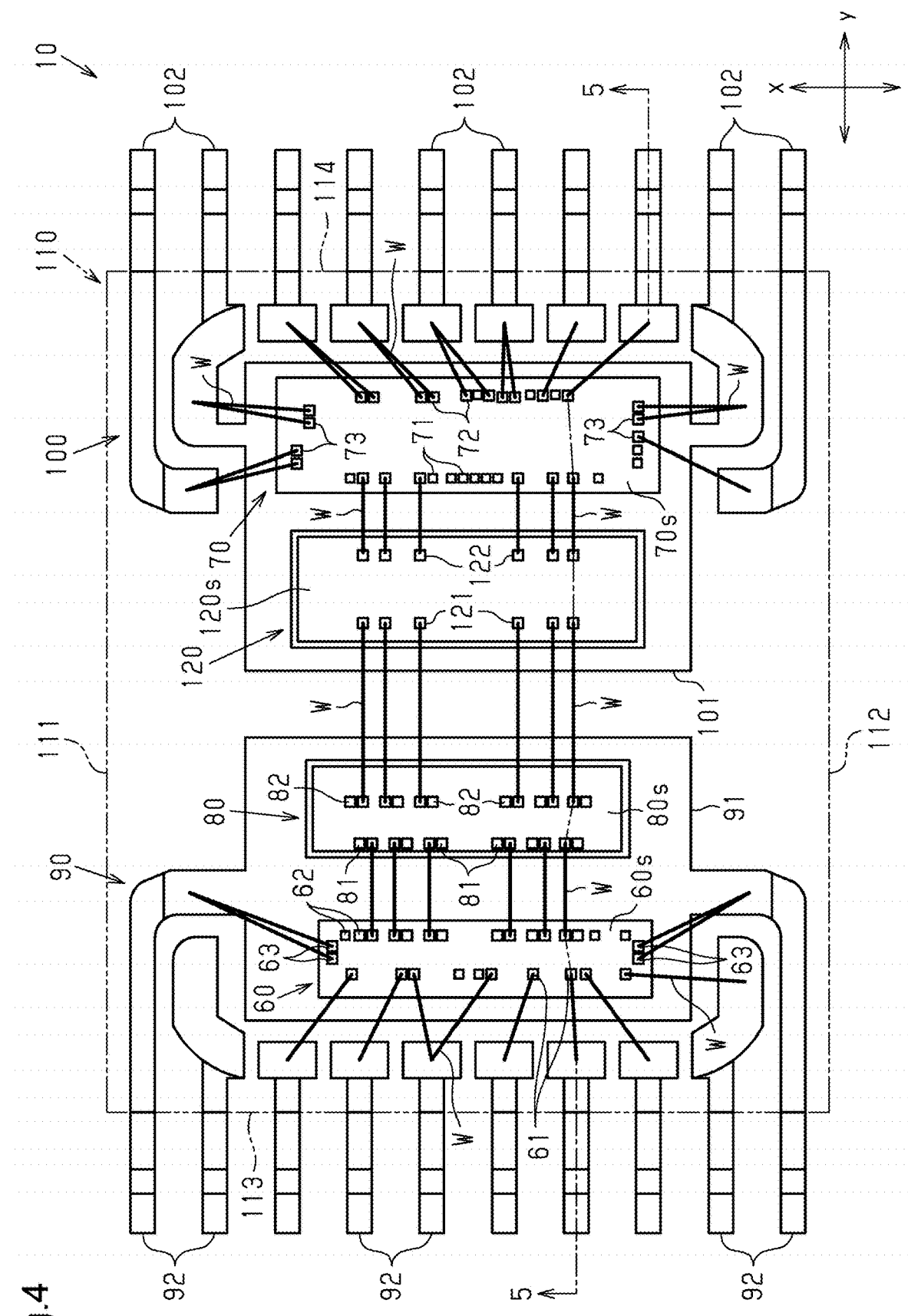
FIG. 4 is a plan view showing an internal structure of a second embodiment of a gate driver.

A second embodiment of a gate driver 10 will be described with reference to FIGS. 4 and 5. The gate driver 10 of the second embodiment differs from the gate driver 10 of the first embodiment mainly in that the capacitor 50 is not incorporated in the high-voltage circuit chip 70 and a capacitor chip 120 is included as a separate semiconductor chip. In the following description, the differences from the gate driver 10 of the first embodiment will be mainly described. The same reference characters are given to those components that are the same as the corresponding components of the gate driver 10 of the first embodiment. Such components will not be described in detail. In FIG. 4, the encapsulation resin 110 is indicated by double-dashed lines to illustrate the internal structure of the gate driver 10.

As shown in FIG. 4, the gate driver 10 includes the low-voltage circuit chip 60, the high-voltage circuit chip 70, the transformer chip 80, and a capacitor chip 120. The chips 60, 70, 80, and 120 are encapsulated by the encapsulation resin 110. The low-voltage circuit chip 60, the high-voltage circuit chip 70, the transformer chip 80, and the capacitor chip 120 are spaced apart from each other in the y-direction. In other words, the chips 60, 70, 80, and 120 are arranged in the arrangement direction of the low-voltage die pad 91 and the high-voltage die pad 101.

In the second embodiment, the low-voltage circuit chip 60, the transformer chip 80, the capacitor chip 120, and the high-voltage circuit chip 70 are arranged in this order from the low-voltage leads 92 toward the high-voltage leads 102. In other words, in plan view, the transformer chip 80 and the capacitor chip 120 are disposed between the low-voltage circuit chip 60 and the high-voltage circuit chip 70. In plan view, the transformer chip 80 is disposed between the low-voltage circuit chip 60 and the capacitor chip 120, and the capacitor chip 120 is disposed between the transformer chip 80 and the high-voltage circuit chip 70.

In the same manner as the first embodiment, the low-voltage circuit chip 60 and the transformer chip 80 are mounted on the low-voltage die pad 91 of the low-voltage lead frame 90.

In the second embodiment, the capacitor chip 120 and the high-voltage circuit chip 70 are mounted on the high-voltage die pad 101 of the high-voltage lead frame 100. In the second embodiment, the dimension of the high-voltage die pad 101 in the y-direction is larger than that in the first embodiment to ensure the space for mounting the capacitor chip 120. In an example, the dimension of the high-voltage die pad 101 in the y-direction is equal to the dimension of the low-voltage die pad 91 in the y-direction.

In plan view, the capacitor chip 120 is rectangular and has short sides and long sides. In plan view, the capacitor chip 120 is mounted on the high-voltage die pad 101 such that the long sides extend in the x-direction and the short sides extend in the y-direction. As shown in FIG. 5, the capacitor chip 120 includes a chip main surface 120s and a chip back surface 120r facing in opposite directions in the z-direction. The capacitor chip 120 is bonded to the high-voltage die pad 101 by the conductive bonding material SD.

As shown in FIG. 4, first electrode pads 121 and second electrode pads 122 are formed on the chip main surface 120s of the capacitor chip 120. The first electrode pads 121 are disposed on the chip main surface 120s near the transformer chip 80. The first electrode pads 121 are arranged in the x-direction. The second electrode pads 122 are disposed on the chip main surface 120s near the high-voltage circuit chip 70. The second electrode pads 122 are arranged in the x-direction.

Figure 5:
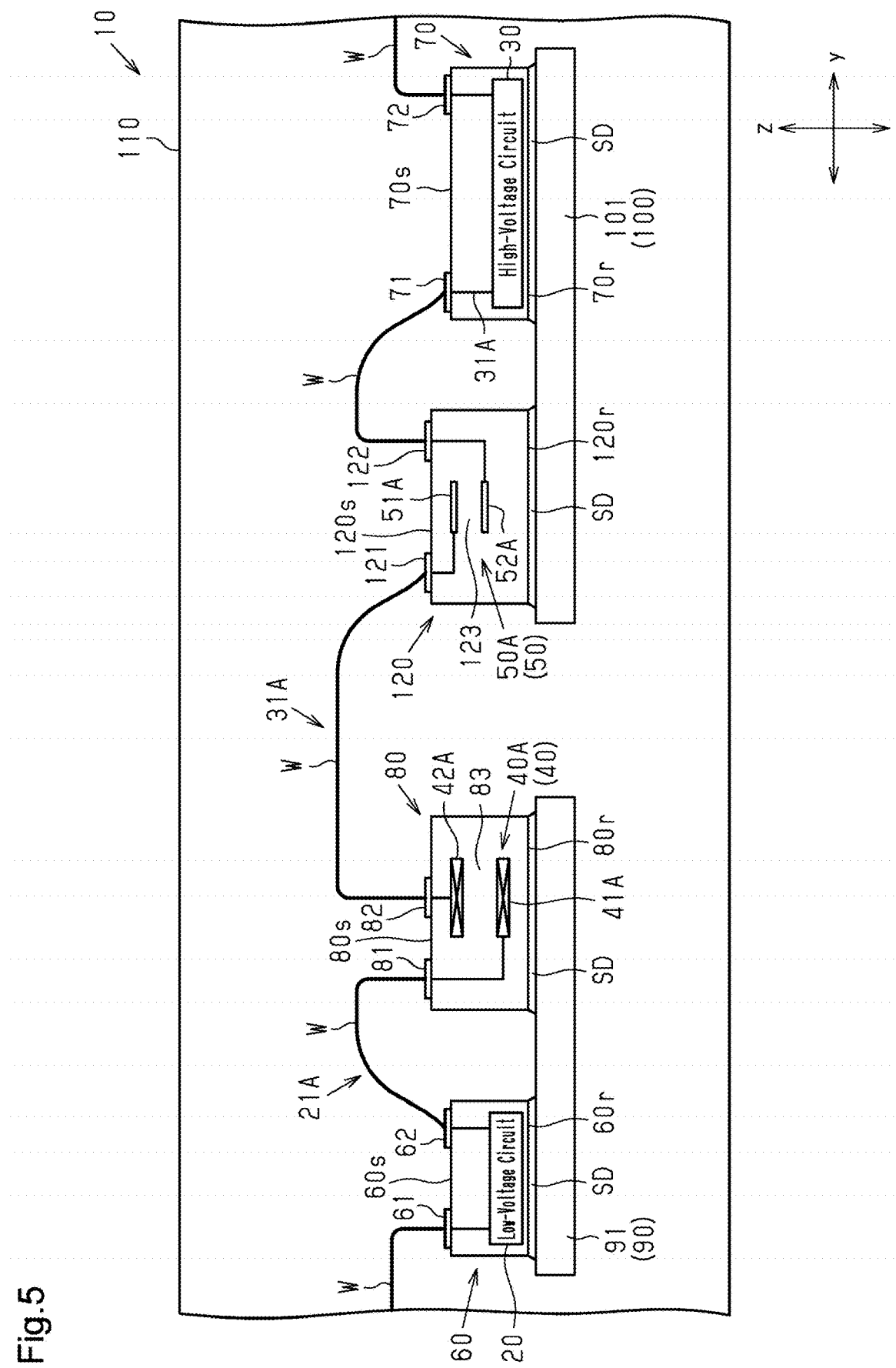
FIG. 5 is a schematic cross-sectional view showing a part of the cross-sectional structure taken along line 5-5 in FIG. 4.

As shown in FIG. 5, the capacitor chip 120 includes the two capacitors 50A and 50B (refer to FIG. 1). More specifically, the capacitors 50A and 50B are arranged in a single package. The capacitor chip 120 includes an insulation layer 123. The two electrodes 51A and 52A of the capacitor 50A are embedded in the insulation layer 123 and spaced apart and opposed to each other in the z-direction with the insulation layer 123 interposed therebetween. In the second embodiment, the first electrode 51A is disposed farther from the high-voltage die pad 101 than the second electrode 52A. In the second embodiment, the insulation layer 123 is formed from a dielectric material. The insulation layer 123 is formed from, for example, $SiO_2$. The insulation layer 123 may be a single layer or multiple layers. Although not shown, the layout of the capacitor 50B in the capacitor chip 120 is the same as that of the capacitor 50A.

The capacitors 50A and 50B are electrically connected to the first electrode pad 121 and the second electrode pad 122 in the capacitor chip 120. In an example, as shown in FIG. 5, the first electrode pad 121 is electrically connected to the first electrode 51A of the capacitor 50A. The second electrode pad 122 is electrically connected to the second electrode 52A of the capacitor 50A.

Although not shown, another first electrode pad 121 is electrically connected to the first electrode 51B of the capacitor 50B. Also, another second electrode pad 122 is electrically connected to the second electrode 52B of the capacitor 50B. The positional relationship between the electrodes 51B and 52B is the same as that between the electrodes 51A and 52A.

The capacitor chip 120 is electrically connected to the transformer chip 80 and the high-voltage circuit chip 70 by wires W. More specifically, the second electrode pads 82 of the transformer chip 80 and the first electrode pads 121 of the capacitor chip 120 are connected by the wires W. The second electrode pads 122 of the capacitor chip 120 and the first electrode pads 71 of the high-voltage circuit chip 70 are connected by the wires W. Thus, the transformer 40, the capacitor 50, and the high-voltage circuit 30 are electrically connected to each other.

The gate driver 10 of the second embodiment obtains the following advantages in addition to the advantages (1-1), (1-2), and (1-8) of the first embodiment.

(2-1) The gate driver 10 includes the low-voltage circuit chip 60 including the low-voltage circuit 20, the high-voltage circuit chip 70 including the high-voltage circuit 30, the transformer chip 80 including the transformer 40, and the capacitor chip 120 including the capacitor 50. The low-voltage circuit chip 60, the transformer chip 80, the capacitor chip 120, and the high-voltage circuit chip 70 are arranged in this order.

With this structure, when adjacent ones of the chips 60, 70, 80, and 120 in the arrangement direction (y-direction) of the chips 60, 70, 80, and 120 are electrically connected to each other by wires W, the wires W do not need to extend over a certain chip. Thus, the connection structure of the wires W is simplified.

In addition, the transformer chip 80 and the capacitor chip 120 are disposed separately from the low-voltage circuit chip 60 and the high-voltage circuit chip 70. This allows the low-voltage circuit chip 60 and the high-voltage circuit chip 70 to use the common transformer chip 80 and the common capacitor chip 120. This reduces the costs for manufacturing different types of gate drivers that differ in at least one of the low-voltage circuit chip 60 and the high-voltage circuit chip 70.

(2-2) The gate driver 10 includes the low-voltage die pad 91 on which the low-voltage circuit chip 60 is mounted and the high-voltage die pad 101 on which the high-voltage circuit chip 70 is mounted. The transformer chip 80 is mounted on the low-voltage die pad 91, and the capacitor chip 120 is mounted on the high-voltage die pad 101.

When the encapsulation resin 110 is formed, the encapsulation resin 110 is more likely to have a void in the vicinity of the die pads 91 and 101 as the area of the die pads 91 and 101 in plan view increases. If the transformer chip 80 and the capacitor chip 120 are mounted on the low-voltage die pad 91, the area of the low-voltage die pad 91 will be excessively increased, and a void may be formed in the vicinity of the low-voltage die pad 91.

In this regard, in the gate driver 10 of the second embodiment, the transformer chip 80 and the capacitor chip 120 are separately mounted on the low-voltage die pad 91 and the high-voltage die pad 101, respectively. This avoids a situation in which one of the low-voltage die pad 91 and the high-voltage die pad 101 is excessively increased in size. Thus, formation of a void in the encapsulation resin 110 caused by an excessive increase in the area of one of the die pads 91 and 101 is limited.

Third Embodiment

A third embodiment of a gate driver 10 will be described with reference to FIGS. 6 and 7. The gate driver 10 of the third embodiment differs from the gate driver 10 of the first embodiment mainly in the position where the capacitor 50 is arranged. In the following description, the differences from the first embodiment will be mainly described. The same reference characters are given to those components that are the same as the corresponding components of the gate driver 10 of the first embodiment. Such components will not be described in detail.

Figure 6:
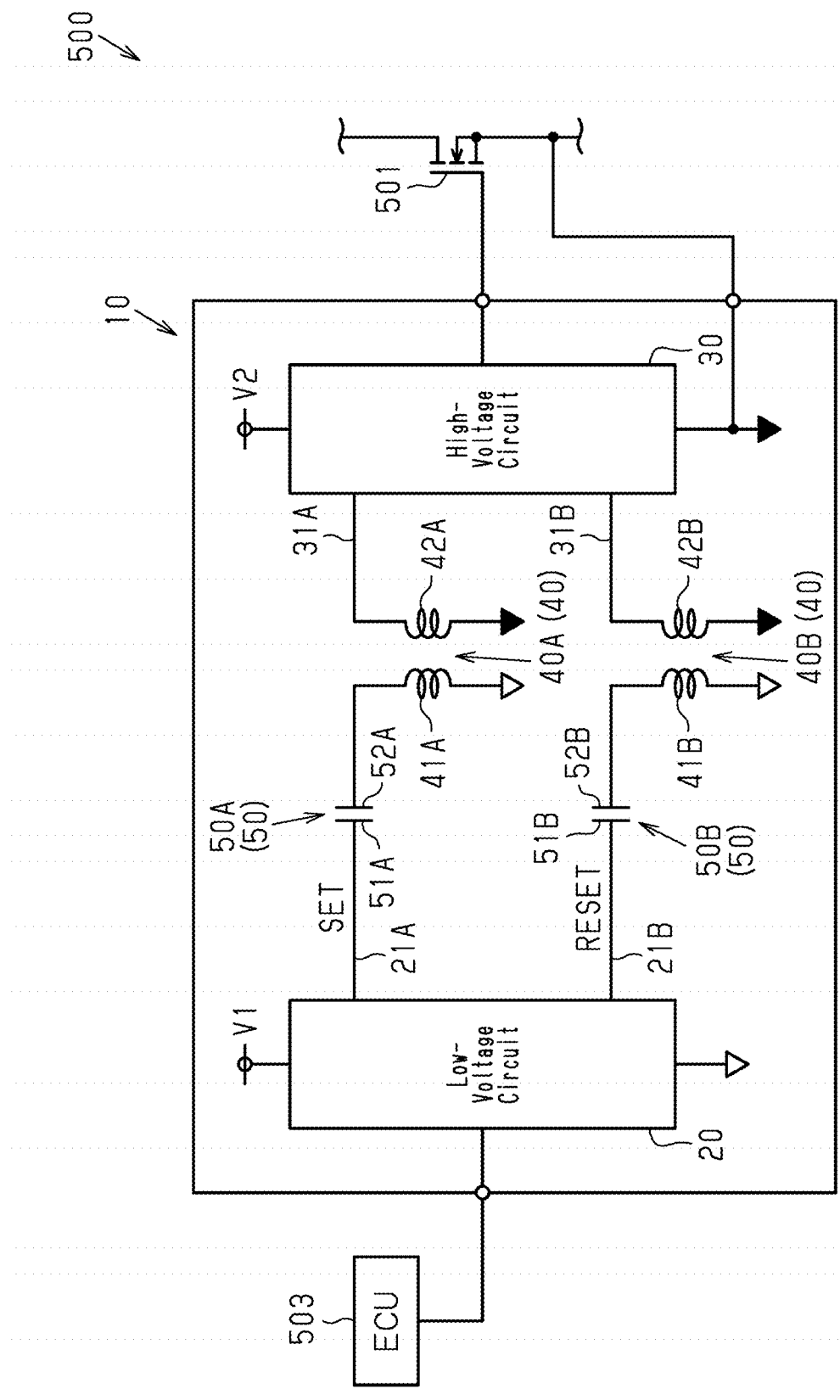
FIG. 6 is a schematic circuit diagram showing a third embodiment of a gate driver.

As shown in FIG. 6, the capacitor 50 is disposed between the low-voltage circuit 20 and the transformer 40 in the circuitry, which differs from the first embodiment. More specifically, the capacitor 50A is disposed between the low-voltage circuit 20 and the transformer 40A in the circuitry, and the capacitor 50B is disposed between the low-voltage circuit 20 and the transformer 40B in the circuitry. In the third embodiment, the transformer 40A and the capacitor 50A are connected in series. The transformer 40B and the capacitor 50B are connected in series.

In the third embodiment, the transformer 40A and the capacitor 50A are connected in series by the low-voltage signal line 21A, and the capacitor 50A and the low-voltage circuit 20 are connected by the low-voltage signal line 21A. Thus, the low-voltage circuit 20 and the transformer 40A are electrically connected through the capacitor 50A. Also, the transformer 40B and the capacitor 50B are connected in series by the low-voltage signal line 21B, and the capacitor 50B and the low-voltage circuit 20 are connected by the low-voltage signal line 21B. Thus, the low-voltage circuit 20 and the transformer 40B are electrically connected through the capacitor 50B. In the third embodiment, the capacitor 50A is not disposed between the transformer 40A and the high-voltage circuit 30 in the circuitry, and the capacitor 50B is not disposed between the transformer 40B and the high-voltage circuit 30 in the circuitry.

Figure 7:
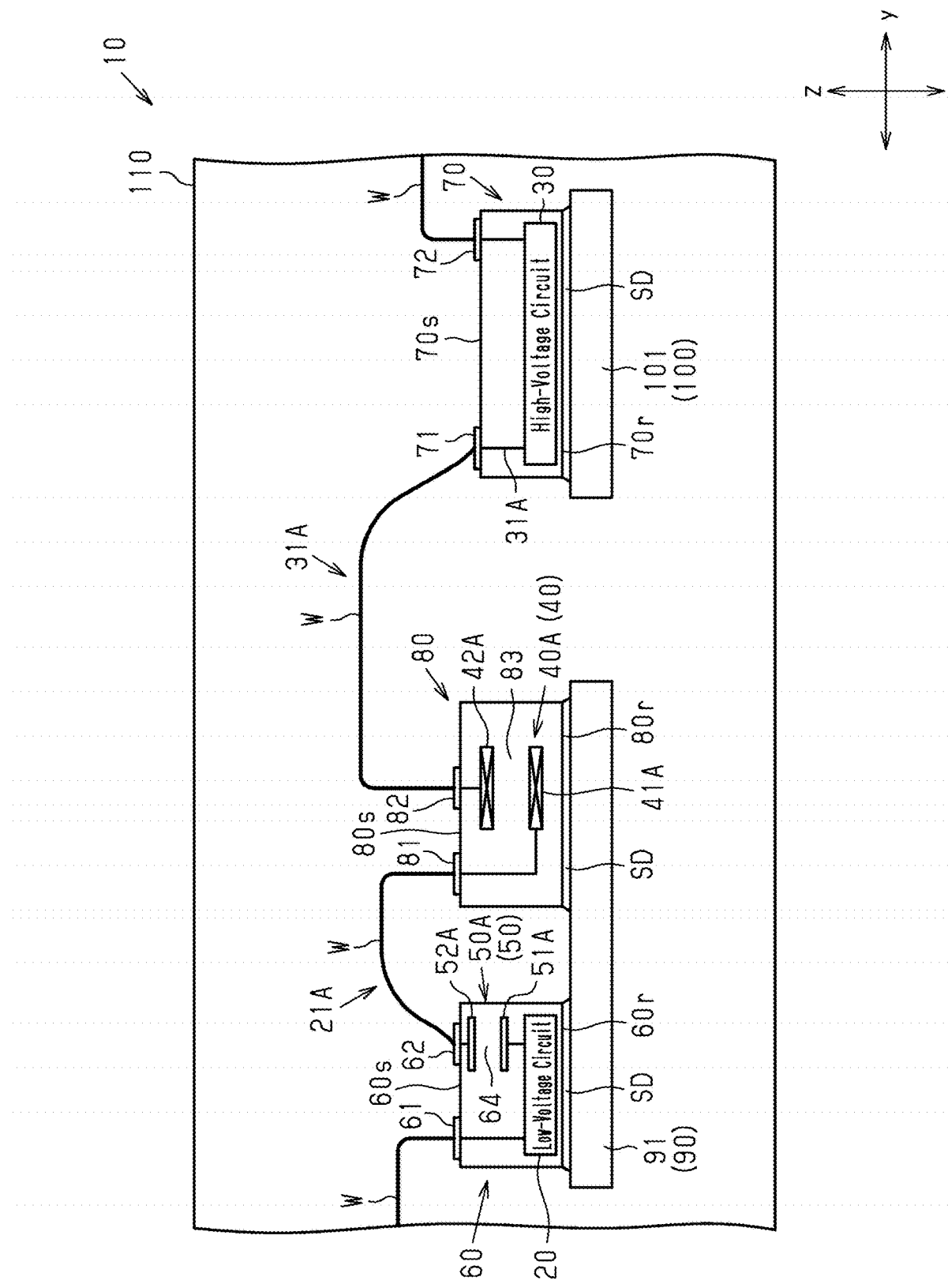
FIG. 7 is a schematic cross-sectional view showing the gate driver of the third embodiment.

As shown in FIG. 7, the gate driver 10 includes the low-voltage circuit chip 60, the high-voltage circuit chip 70, and the transformer chip 80. The layout of the chips 60, 70, and 80 and the structures of the lead frames 90 and 100 are the same as those in the first embodiment. As shown in FIG. 7, the transformer chip 80 is mounted on the low-voltage die pad 91 of the low-voltage lead frame 90.

The capacitors 50A and 50B (refer to FIG. 6) of the third embodiment are incorporated in the low-voltage circuit chip 60. More specifically, the low-voltage circuit chip 60 includes an insulation layer 64. The capacitors 50A and 50B are embedded in the insulation layer 64. The first electrode MA and the second electrode 52A are spaced apart and opposed to each other in the z-direction with the insulation layer 64 disposed therebetween. In the third embodiment, the capacitors 50A and 50B are disposed in a portion of the low-voltage circuit chip 60 located close to the transformer chip 80 in the y-direction. In the third embodiment, the insulation layer 64 is formed from a dielectric material. The insulation layer 64 is formed from, for example, $SiO_2$.

In the third embodiment, the capacitor 50 is located the chip main surface 60s from the low-voltage circuit 20 in the low-voltage circuit chip 60. More specifically, as shown in FIG. 7, the two electrodes 51A and 52A of the capacitor 50A are located toward the chip main surface 60s from the low-voltage circuit 20 in the low-voltage circuit chip 60. In plan view, the capacitors 50A and 50B are disposed to overlap the low-voltage circuit 20 in the low-voltage circuit chip 60. The positions of the capacitors 50A and 50B in the low-voltage circuit chip 60 may be changed in any manner.

The capacitor 50 is electrically connected to the low-voltage circuit 20 and the second electrode pad 62 of the low-voltage circuit chip 60 in the low-voltage circuit chip 60. More specifically, as shown in FIG. 7, the first electrode 51A of the capacitor 50A is electrically connected to the low-voltage circuit 20 in the low-voltage circuit chip 60. The second electrode 52A of the capacitor 50A is electrically connected to the second electrode pad 62 in the low-voltage circuit chip 60.

Although not shown, the capacitor 50B and the capacitor 50A have the same structure. The two electrodes 51B and 52B of the capacitor 50B are also located toward the chip main surface 60s from the low-voltage circuit 20 in the low-voltage circuit chip 60 and are electrically connected to the low-voltage circuit 20 and the second electrode pad 62 of the low-voltage circuit chip 60 in the low-voltage circuit chip 60.

In the same manner as the first embodiment, the second electrode pad 62 is connected to the first electrode pad 81 of the transformer chip 80 by the wire W. More specifically, the second electrode pad 62 electrically connected to the second electrode 52A of the capacitor 50A is connected by the wire W to the first electrode pad 81 electrically connected to the first coil 41A of the transformer 40A. Although not shown, the second electrode pad 62 electrically connected to the second electrode 52B of the capacitor 50B is connected by the wire W to the first electrode pad 81 electrically connected to the first coil 41B of the transformer 40B.

The gate driver 10 of the third embodiment obtains the following advantages in addition to the advantages (1-1), (1-3), (1-7), and (1-8) of the first embodiment.

(3-1) The first electrode 51A of the capacitor 50A is electrically connected to the low-voltage circuit 20, and the second electrode 52A of the capacitor 50A is electrically connected to the transformer 40A. The first electrode 51B of the capacitor 50B is electrically connected to the low-voltage circuit 20, and the second electrode 52B of the capacitor 50B is electrically connected to the transformer 40B. With this structure, when a dielectric breakdown occurs in the transformer 40A due to a short circuit between the first coil 41A and the second coil 42A, the capacitor 50A maintains insulation between the low-voltage circuit 20 and the high-voltage circuit 30. When a dielectric breakdown occurs in the transformer 40B due to a short circuit between the first coil 41B and the second coil 42B, the capacitor 50B maintains insulation between the low-voltage circuit 20 and the high-voltage circuit 30. This inhibits application of a high voltage to the low-voltage circuit 20 due to the dielectric breakdown of the transformers 40A and 40B, thereby limiting application of a high voltage to the low-voltage lead frame 90.

(3-2) The capacitors 50A and 50B are incorporated in the low-voltage circuit chip 60.

With this structure, the number of chips in the gate driver 10 is reduced as compared with a structure in which the capacitors 50A and 50B are separate chips. This allows enlargement of the gate driver 10 to be limited.

(3-3) In the low-voltage circuit chip 60, the capacitors 50A and 50B are disposed to overlap the low-voltage circuit 20 in plan view. This structure allows enlargement of the low-voltage circuit chip 60 to be limited.

(3-4) The capacitors 50A and 50B are disposed in the low-voltage circuit chip 60 near the transformer chip 80. This structure shortens a conductive path between the capacitor 50A and the transformer 40A and a conductive path between the capacitor 50B and the transformer 40B. As a result, inductance caused by the length of the conductive paths is reduced.

Fourth Embodiment

Figure 8:
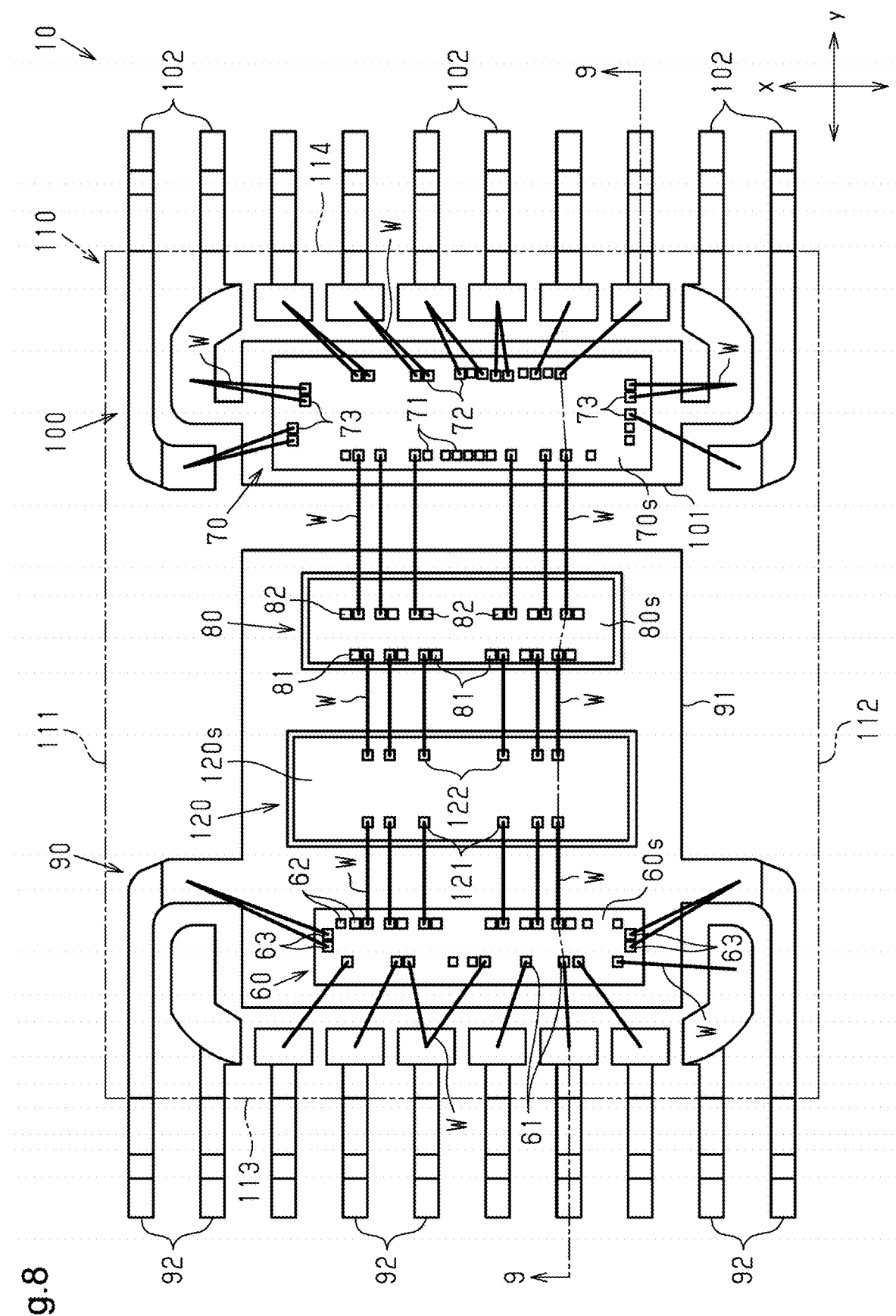
FIG. 8 is a plan view showing an internal structure of a fourth embodiment of a gate driver.

A fourth embodiment of a gate driver 10 will be described with reference to FIGS. 8 and 9. The gate driver 10 of the fourth embodiment differs from the gate driver 10 of the third embodiment mainly in that the capacitor 50 is not incorporated in the low-voltage circuit chip 60 and a capacitor chip 120 is included as a separate semiconductor chip. In the following description, the differences from the gate driver 10 of the third embodiment will be mainly described. The same reference characters are given to those components that are the same as the corresponding components of the gate driver 10 of the third embodiment. Such components will not be described in detail. In FIG. 8, the encapsulation resin 110 is indicated by double-dashed lines to illustrate the internal structure of the gate driver 10.

As shown in FIG. 8, the gate driver 10 includes the low-voltage circuit chip 60, the high-voltage circuit chip 70, the transformer chip 80, and a capacitor chip 120. The chips 60, 70, 80, and 120 are encapsulated by the encapsulation resin 110. The low-voltage circuit chip 60, the high-voltage circuit chip 70, the transformer chip 80, and the capacitor chip 120 are spaced apart from each other in the y-direction. In other words, the chips 60, 70, 80, and 120 are arranged in the arrangement direction of the low-voltage die pad 91 and the high-voltage die pad 101.

In the fourth embodiment, the low-voltage circuit chip 60, the capacitor chip 120, the transformer chip 80, and the high-voltage circuit chip 70 are arranged in this order from the low-voltage leads 92 toward the high-voltage leads 102. In other words, in plan view, the capacitor chip 120 and the transformer chip 80 are disposed between the low-voltage circuit chip 60 and the high-voltage circuit chip 70, and the capacitor chip 120 is disposed between the low-voltage circuit chip 60 and the transformer chip 80.

In the fourth embodiment, the low-voltage circuit chip 60, the capacitor chip 120, and the transformer chip 80 are mounted on the low-voltage die pad 91 of the low-voltage lead frame 90. The capacitor chip 120 is bonded to the low-voltage die pad 91 by the conductive bonding material SD (refer to FIG. 9). The shape and the arrangement position of the capacitor chip 120 in plan view are the same as those in the second embodiment. In the fourth embodiment, the dimension of the low-voltage die pad 91 in the y-direction is larger than that in the third embodiment to ensure the space for mounting the capacitor chip 120. In the transformer chip 80, the first coil 41A is separated from the low-voltage die pad 91 by a distance sufficient to maintain insulation between the transformer chip 80 and the low-voltage die pad 91.

Only the high-voltage circuit chip 70 is mounted on the high-voltage die pad 101 of the high-voltage lead frame 100.

The high-voltage die pad 101 of the fourth embodiment is the same as the high-voltage die pad 101 of the first embodiment.

The capacitor chip 120 is electrically connected to the low-voltage circuit chip 60 and the transformer chip 80 by wires W. More specifically, the first electrode pads 121 of the capacitor chip 120 and the second electrode pads 62 of the low-voltage circuit chip 60 are connected by the wires W. The second electrode pads 122 of the capacitor chip 120 and the first electrode pads 81 of the transformer chip 80 are connected by the wires W.

Figure 9:
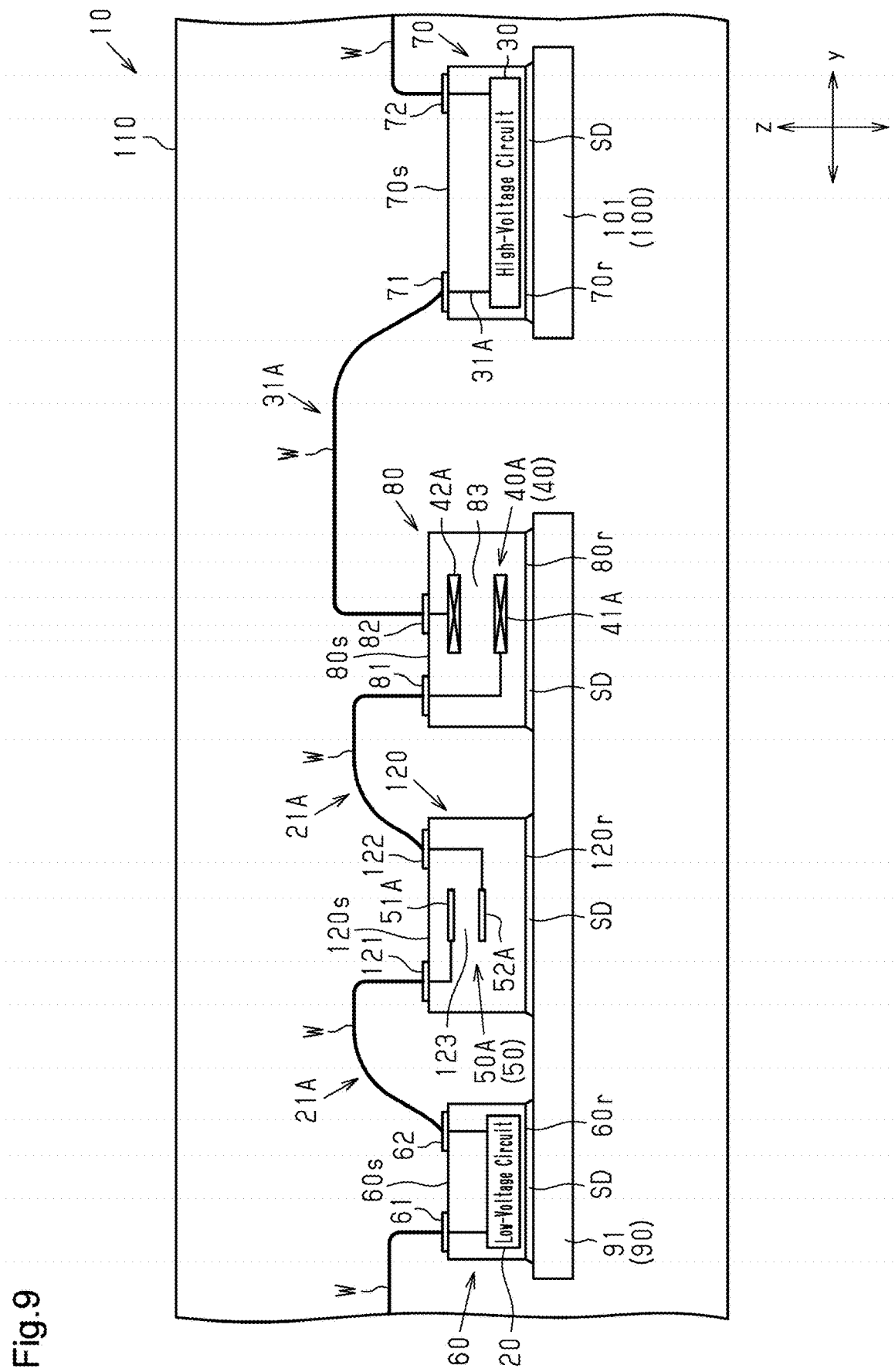
FIG. 9 is a schematic cross-sectional view showing a part of the cross-sectional structure taken along line 9-9 in FIG. 8.

As shown in FIG. 9, the first electrode pad 121 electrically connected to the first electrode MA of the capacitor 50A is connected by the wire W to the second electrode pad 62 electrically connected to the low-voltage circuit 20. Thus, the first electrode MA of the capacitor 50A is electrically connected to the low-voltage circuit 20. The second electrode pad 122 electrically connected to the second electrode 52A of the capacitor 50A is electrically connected by the wire W to the second electrode pad 62 electrically connected to the first coil 41A of the transformer 40A. Thus, the second electrode 52A of the capacitor 50A is electrically connected to the first coil 41A of the transformer 40A.

Although not shown, in the same manner as the capacitor 50A, the first electrode 51B of the capacitor 50B is electrically connected to the low-voltage circuit 20, and the second electrode 52B of the capacitor 50B is electrically connected to the first coil 41B of the transformer 40B.

The gate driver 10 of the fourth embodiment obtains the following advantages in addition to the advantage (3-1) of the third embodiment.

(4-1) The gate driver 10 includes the low-voltage circuit chip 60 including the low-voltage circuit 20, the high-voltage circuit chip 70 including the high-voltage circuit 30, the transformer chip 80 including the transformer 40, and the capacitor chip 120 including the capacitor 50. The low-voltage circuit chip 60, the capacitor chip 120, the transformer chip 80, and the high-voltage circuit chip 70 are arranged in this order. With this structure, the advantage (2-1) of the second embodiment is obtained.

Fifth Embodiment

A fifth embodiment of a gate driver 10 will be described with reference to FIGS. 10 and 11. The gate driver 10 of the fifth embodiment differs from the gate driver 10 of the first embodiment in that the transformer includes a plurality of transformers having a double insulation structure. In the following description, the differences from the first embodiment will be described. The same reference characters are given to those components that are the same as the corresponding components of the gate driver 10 of the first embodiment. Such components will not be described in detail.

Figure 10:
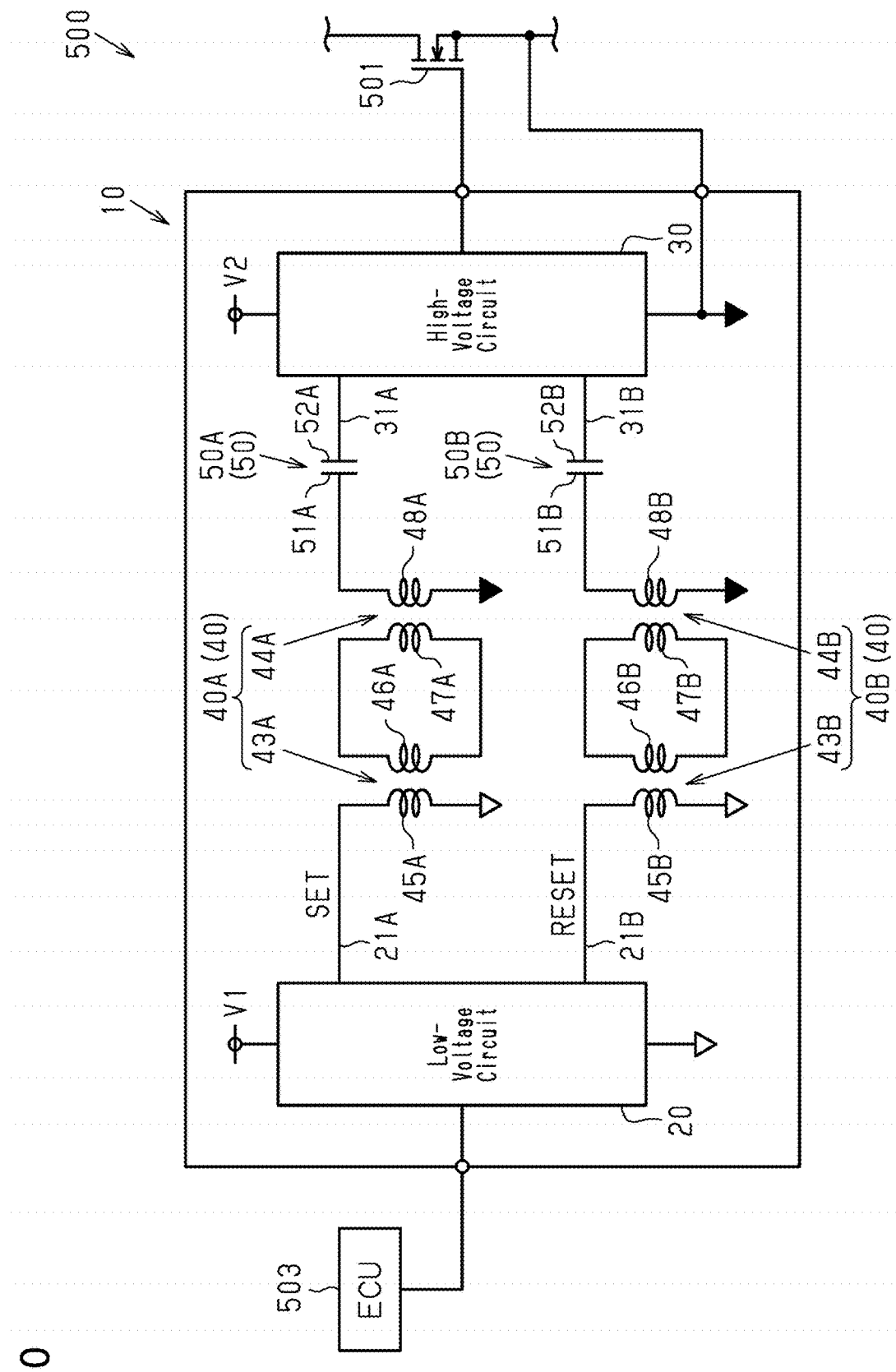
FIG. 10 is a schematic circuit diagram showing a fifth embodiment of a gate driver.

As shown in FIG. 10, the transformer 40A of the transformer 40 includes a first transformer 43A and a second transformer 44A that are connected in series. The transformer 40B includes a first transformer 43B and a second transformer 44B that are connected in series. As described above, each of the transformers 40A and 40B has a double insulation structure. Thus, the insulation voltage of the gate driver 10 is greater than that in the first to fourth embodiments and is, for example, approximately 5000 Vrms.

The first transformer 43A is electrically connected to the low-voltage circuit 20. The first transformer 43A includes a first coil 45A and a second coil 46A that is insulated from and configured to be magnetically coupled to the first coil 45A.

The second transformer 44A is electrically connected to the high-voltage circuit 30. In other words, the second transformer 44A is disposed on a signal line connecting the first transformer 43A and the high-voltage circuit 30. The second transformer 44A includes a first coil 47A and a second coil 48A that is insulated from and configured to be magnetically coupled to the first coil 47A.

The first coil 45A is electrically connected to the low-voltage circuit 20 by the low-voltage signal line 21A and is also connected to the ground of the low-voltage circuit 20. More specifically, the first coil 45A includes a first end electrically connected to the low-voltage circuit 20 and a second end electrically connected to the ground of the low-voltage circuit 20. Thus, the potential of the second end of the first coil 45A equals the first reference potential. The first reference potential is, for example, 0 V.

The second coil 46A is connected to the first coil 47A of the second transformer 44A. In an example, the second coil 46A and the first coil 47A are connected to each other so as to be electrically floating. More specifically, the second coil 46A includes a first end connected to a first end of the first coil 47A, and a second end connected to a second end of the first coil 47A. Thus, the second coil 46A and the first coil 47A serve as relay coils that relay transmission of a set signal from the first coil 45A to the second coil 48A.

The second coil 48A is electrically connected to the high-voltage circuit 30 through the capacitor 50A by the high-voltage signal line 31A and is also connected to the ground of the high-voltage circuit 30. More specifically, the second coil 48A includes a first end electrically connected to the high-voltage circuit 30 through the capacitor 50A and a second end electrically connected to the ground of the high-voltage circuit 30. Thus, the potential of the second end of the second coil 48A equals the second reference potential. The second reference potential varies as the inverter device 500 is driven and is, for example, greater than or equal to 600 V.

In the same manner as the first embodiment, the capacitor 50A is disposed on the high-voltage signal line 31A. The capacitor 50A is disposed between the second transformer 44A and the high-voltage circuit 30. Thus, the capacitor 50A is disposed on the high-voltage signal line 31A that connects the second transformer 44A and the high-voltage circuit 30. The capacitor 50A is connected in series to the second transformer 44A. The first electrode MA of the capacitor 50A is electrically connected to the second coil 48A, and the second electrode 52A of the capacitor 50A is electrically connected to the high-voltage circuit 30.

The first transformer 43B of the transformer 40B includes a first coil 45B electrically connected to the low-voltage circuit 20 and a second coil 46B insulated from and configured to be magnetically coupled to the first coil 45B.

The second transformer 44B of the transformer 40B includes a first coil 47B electrically connected to the high-voltage circuit 30 and a second coil 48B insulated from and configured to be magnetically coupled to the first coil 47B. The transformer 40B and the capacitor 50B are the same as the transformer 40A and the capacitor 50A and thus will not be described in detail.

Figure 11:
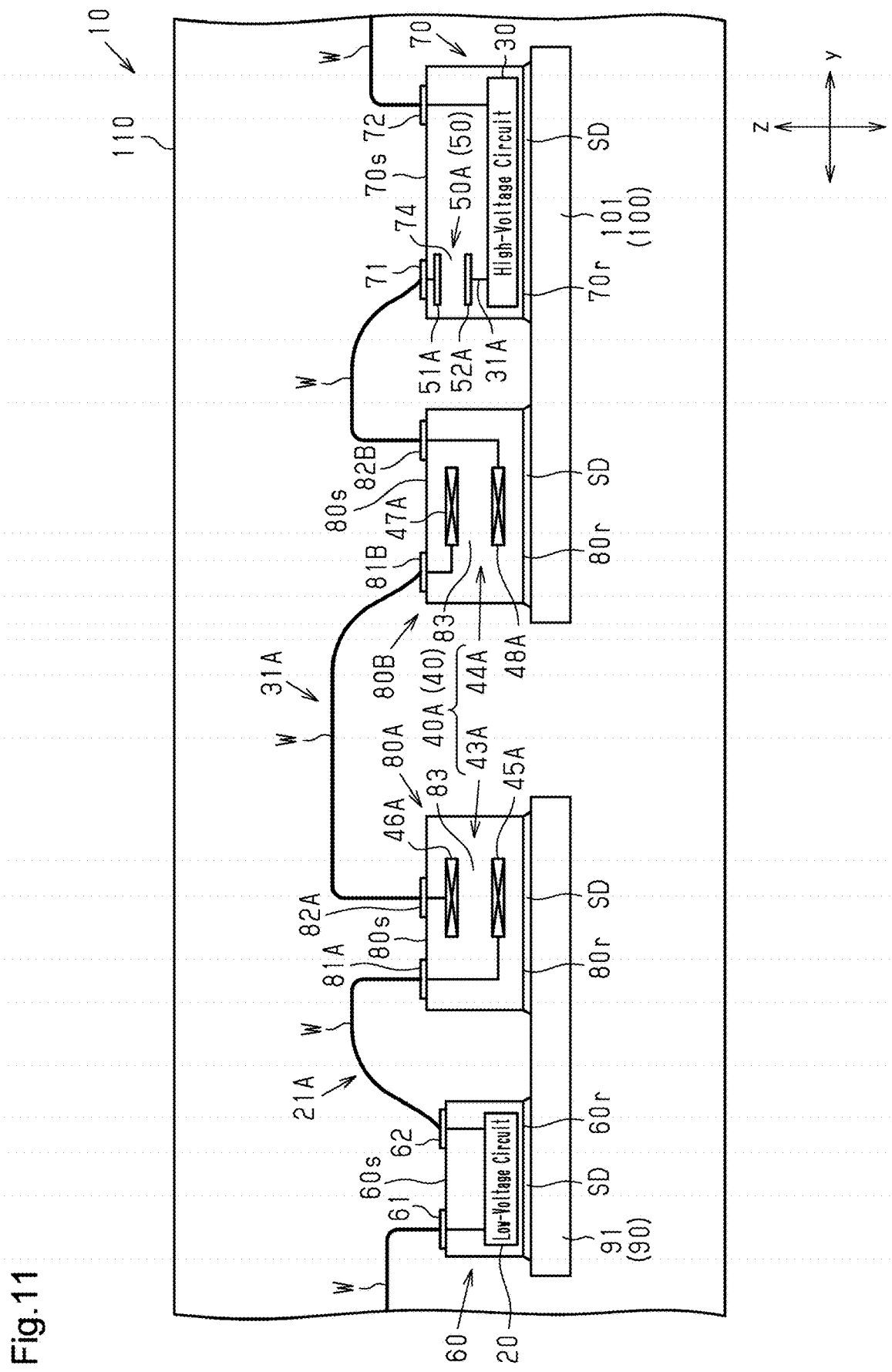
FIG. 11 is a schematic cross-sectional view showing the gate driver of the fifth embodiment.

As shown in FIG. 11, the gate driver 10 includes the low-voltage circuit chip 60, the high-voltage circuit chip 70, a first transformer chip 80A, and a second transformer chip 80B. The low-voltage circuit chip 60, the high-voltage circuit chip 70, the first transformer chip 80A, and the second transformer chip 80B are spaced apart from each other in the y-direction. In other words, the chips 60, 70, 80A, and 80B are arranged in the arrangement direction of the low-voltage die pad 91 and the high-voltage die pad 101.

In the fifth embodiment, the low-voltage circuit chip 60, the first transformer chip 80A, the second transformer chip 80B, and the high-voltage circuit chip 70 are arranged in this order from the low-voltage leads 92 toward the high-voltage leads 102 (refer to FIG. 2). In other words, in plan view, the transformer chips 80A and 80B are disposed between the low-voltage circuit chip 60 and the high-voltage circuit chip 70.

In the fifth embodiment, the low-voltage circuit chip 60 and the first transformer chip 80A are mounted on the low-voltage die pad 91 of the low-voltage lead frame 90. The high-voltage circuit chip 70 and the second transformer chip 80B are mounted on the high-voltage die pad 101 of the high-voltage lead frame 100.

The first transformer chip 80A includes the first transformer 43A of the transformer 40A and the first transformer 43B of the transformer 40B (refer to FIG. 10). More specifically, the transformers 43A and 43B are arranged into a single package. Thus, the first transformer chip 80A includes ones of the transformers 40A and 40B that are located closer to the low-voltage circuit 20 than to the high-voltage circuit 30 in the circuitry.

As shown in FIG. 11, the first transformer chip 80A includes the insulation layer 83 in the same manner as the transformer chip 80 of the first embodiment. The two coils 45A and 46A of the first transformer 43A are embedded in the insulation layer 83 and are spaced apart and opposed to each other in the z-direction with the insulation layer 83 interposed therebetween. The insulation layer 83 may be a single layer or multiple layers.

The two coils 45A and 46A are formed of a conductive layer embedded in the insulation layer 83. In the fifth embodiment, the second coil 46A is disposed farther from the low-voltage die pad 91 than the first coil 45A. The first coil 45A is electrically connected to a first electrode pad 81A, and the second coil 46A is electrically connected to a second electrode pad 82A. Although not shown, the layout of the first transformer 43B in the first transformer chip 80A is the same as that of the first transformer 43A.

The second transformer chip 80B includes the second transformer 44A of the transformer 40A and the second transformer 44B of the transformer 40B (refer to FIG. 10). More specifically, the transformers 44A and 44B are arranged into a single package. Thus, the second transformer chip 80B includes ones of the transformers 40A and 40B that are located closer to the high-voltage circuit 30 than to the low-voltage circuit 20 in the circuitry.

As shown in FIG. 11, the second transformer chip 80B includes the insulation layer 83 in the same manner as the transformer chip 80 of the first embodiment. The two coils 47A and 48A of the second transformer 44A are embedded in the insulation layer 83 and are spaced apart and opposed to each other in the z-direction with the insulation layer 83 interposed therebetween. The insulation layer 83 may be a single layer or multiple layers.

The two coils 47A and 48A are formed of a conductive layer embedded in the insulation layer 83. In the fifth embodiment, the first coil 47A is disposed farther from the high-voltage die pad 101 than the second coil 48A. The first coil 47A is electrically connected to the first electrode pad 81B, and the second coil 48A is electrically connected to the second electrode pad 82B. Although not shown, the layout of the second transformer 44B in the second transformer chip 80B is the same as that of the second transformer 44A.

The low-voltage circuit chip 60 and the first transformer chip 80A are connected by wires W. More specifically, the second electrode pads 62 of the low-voltage circuit chip 60 and the first electrode pads 81A of the first transformer chip 80A are connected by the wires W. Thus, the low-voltage circuit 20 is electrically connected to the first coil 45A of the first transformer 43A and the first coil 45B of the first transformer 43B.

The first transformer chip 80A and the second transformer chip 80B are connected by wires W. More specifically, the second electrode pads 82A of the first transformer chip 80A and the first electrode pads 81B of the second transformer chip 80B are connected by the wires W. Thus, the second coil 46A of the first transformer 43A is electrically connected to the first coil 47A of the second transformer 44A, and the second coil 46B of the first transformer 43B is electrically connected to the first coil 47B of the second transformer 44B (refer to FIG. 10).

The second transformer chip 80B and the high-voltage circuit chip 70 are connected by wires W. More specifically, the second electrode pads 82B of the second transformer chip 80B and the first electrode pads 71 of the high-voltage circuit chip 70 are connected by the wires W. Thus, the second coil 48A of the second transformer 44A is electrically connected to the first electrode MA of the capacitor 50A, and the second coil 48B of the second transformer 44B is electrically connected to the first electrode MB of the capacitor 50B (refer to FIG. 10).

The gate driver 10 of the fifth embodiment obtains the following advantages in addition to the advantages (1-1) to (1-8) of the first embodiment.

(5-1) The transformer 40A includes the first transformer 43A and the second transformer 44A connected in series. The transformer 40B includes the first transformer 43B and the second transformer 44B connected in series. With this structure, the first transformer 43A and the second transformer 44A form a double insulation structure between the low-voltage circuit 20 and the high-voltage circuit 30 in the signal line that transmits the set signal. The first transformer 43B and the second transformer 44B form a double insulation structure between the low-voltage circuit 20 and the high-voltage circuit 30 in the signal line that transmits the reset signal. This improves the insulation voltage of the gate driver 10.

Sixth Embodiment

A sixth embodiment of a gate driver 10 will be described with reference to FIGS. 12 and 13. The gate driver 10 of the sixth embodiment differs from the gate driver 10 of the second embodiment mainly in that the gate driver 10 of the sixth embodiment includes a plurality of packages. In the following description, the differences from the second embodiment will be described. The same reference characters are given to those components that are the same as the corresponding components of the gate driver 10 of the second embodiment. Such components will not be described in detail.

Figure 12:
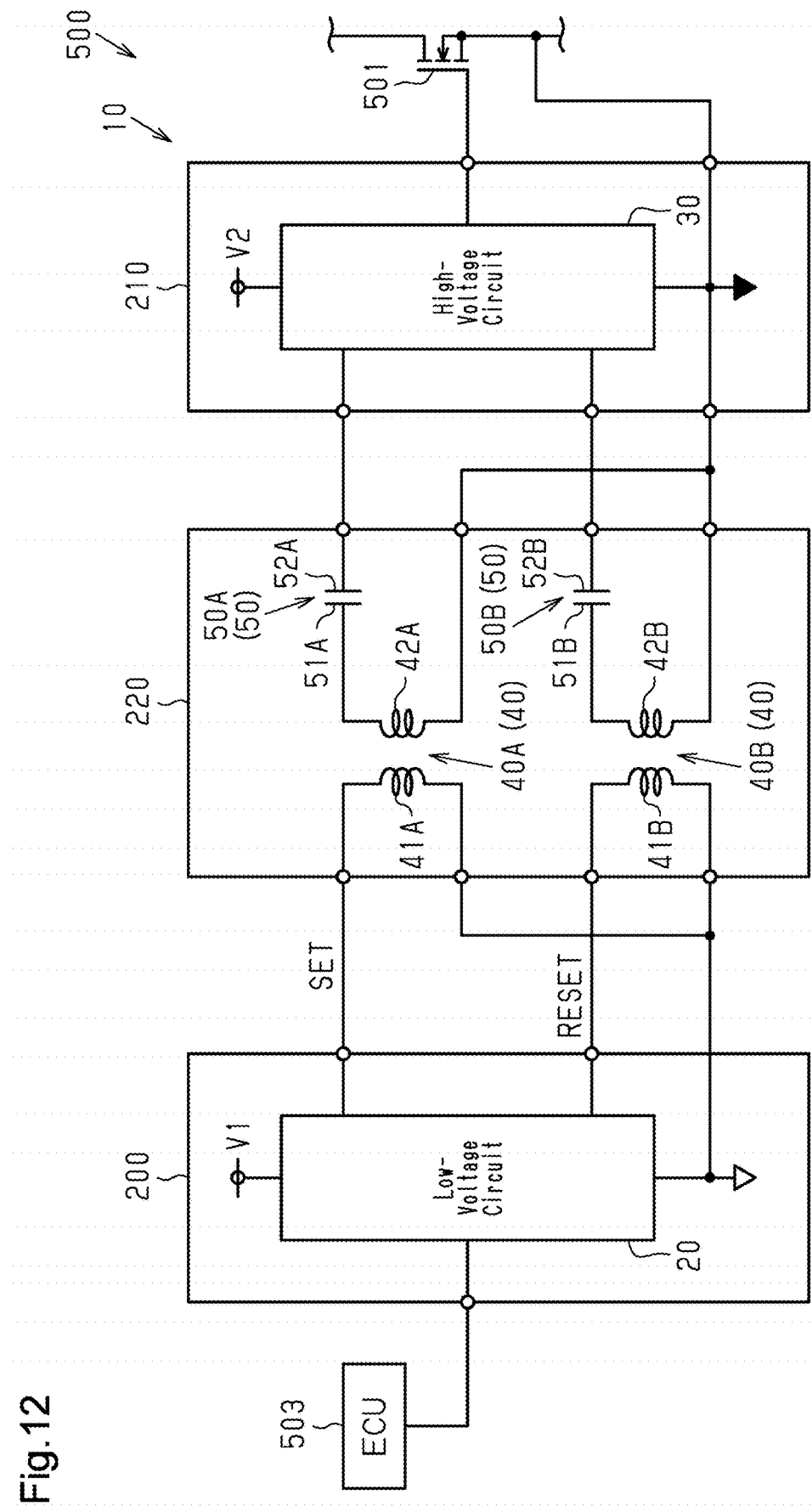
FIG. 12 is a schematic circuit diagram showing a sixth embodiment of a gate driver.

As shown in FIG. 12, the gate driver 10 of the sixth embodiment has the same circuit configuration as the gate driver 10 of the first embodiment. The gate driver 10 includes a low-voltage circuit module 200, a high-voltage circuit module 210, and an insulation module 220.

The low-voltage circuit module 200 includes a low-voltage circuit 20. In an example, although not shown, the low-voltage circuit module 200 includes a low-voltage circuit chip including the low-voltage circuit 20, a low-voltage lead frame including a low-voltage die pad on which the low-voltage circuit chip is mounted, and an encapsulation resin encapsulating a part of the low-voltage lead frame and the low-voltage circuit chip.

The high-voltage circuit module 210 includes a high-voltage circuit 30. In an example, although not shown, the high-voltage circuit module 210 includes a high-voltage circuit chip including the high-voltage circuit 30, a high-voltage lead frame including a high-voltage die pad on which the high-voltage circuit chip is mounted, and an encapsulation resin encapsulating a part of the high-voltage lead frame and the high-voltage circuit chip.

The insulation module 220 insulates the low-voltage circuit 20 from the high-voltage circuit 30 while allowing transmission of the set signal and the reset signal from the low-voltage circuit 20 to the high-voltage circuit 30. That is, the insulation module 220 is used to insulate the low-voltage circuit 20 and the high-voltage circuit 30 included in the gate driver 10. The insulation module 220 includes a transformer 40 and a capacitor 50. In the same manner as the first embodiment, the transformer 40 and the capacitor 50 are used to transmit signals (set signal and reset signal) between the low-voltage circuit 20 and the high-voltage circuit 30. As shown in FIG. 12, the insulation module 220 is disposed between the low-voltage circuit 20 and the high-voltage circuit 30 in the circuitry. Thus, the low-voltage circuit 20 and the high-voltage circuit 30 are connected by the transformer 40 and the capacitor 50.

Figure 13:
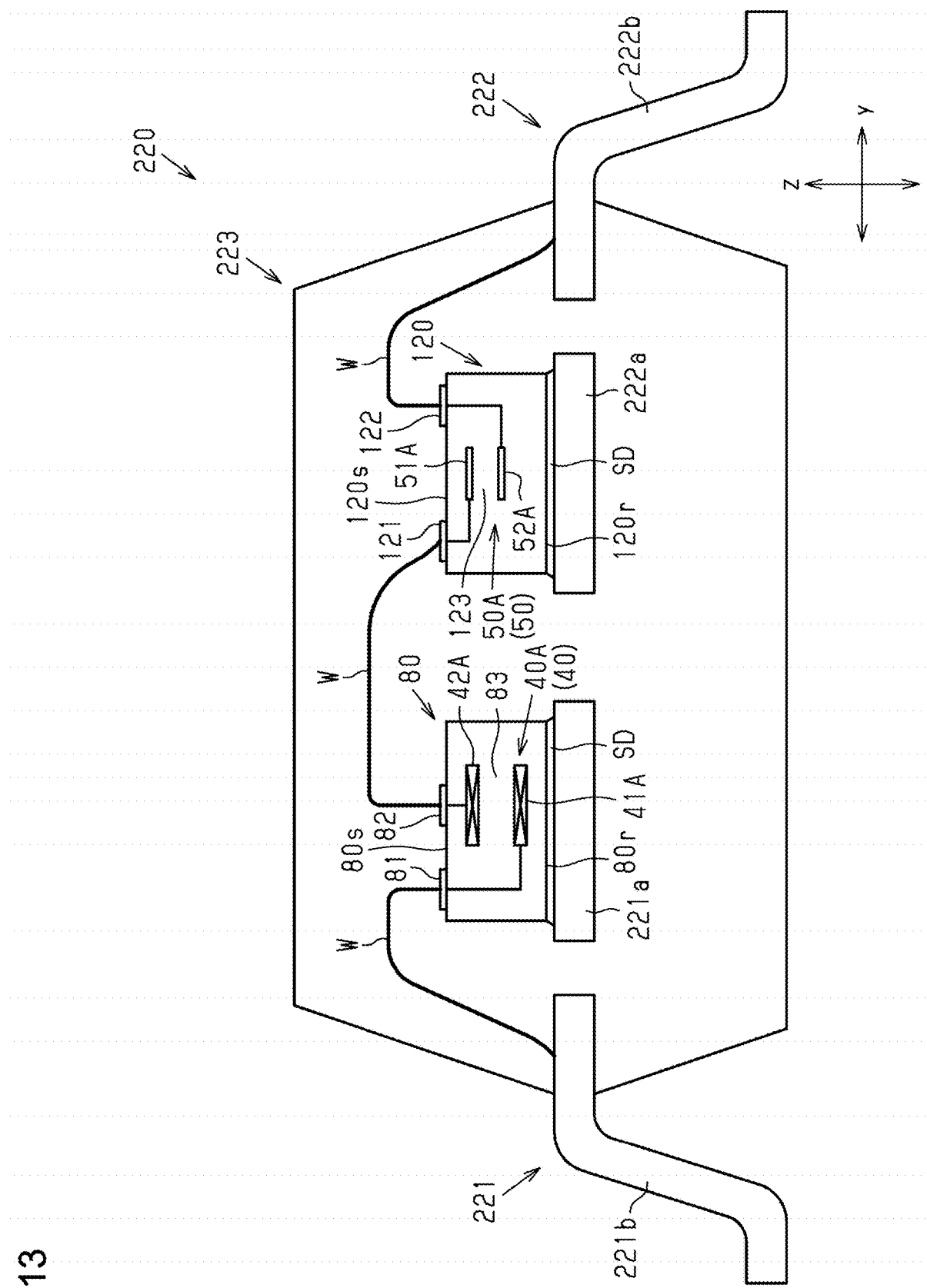
FIG. 13 is a schematic cross-sectional view showing an insulation module of the sixth embodiment.

FIG. 13 shows an example of a schematic cross-sectional structure of the insulation module 220. As shown in FIG. 13, the insulation module 220 includes a transformer chip 80, a capacitor chip 120, a low-voltage lead frame 221, a high-voltage lead frame 222, and an encapsulation resin 223 that encapsulates the transformer chip 80, the capacitor chip 120, and a part of each of the lead frames 221 and 222.

The lead frames 221 and 222 are formed from a conductor and, in the sixth embodiment, are formed from Cu. The lead frames 221 and 222 are disposed to extend from the inside to the outside of the encapsulation resin 223.

The low-voltage lead frame 221 is electrically connected to the low-voltage circuit 20 (refer to FIG. 12) and includes a low-voltage die pad 221a disposed in the encapsulation resin 223 and a plurality of low-voltage leads 221b disposed to extend from the inside to the outside of the encapsulation resin 223. The low-voltage leads 221b include external terminals electrically connected to the low-voltage circuit 20.

The high-voltage lead frame 222 is electrically connected to the high-voltage circuit 30 (refer to FIG. 12) and includes a high-voltage die pad 222a disposed in the encapsulation resin 223 and a plurality of high-voltage leads 222b disposed to extend from the inside to the outside of the encapsulation resin 223. The high-voltage leads 222b include external terminals electrically connected to the high-voltage circuit 30.

In the sixth embodiment, the transformer chip 80 is mounted on the low-voltage die pad 221a, and the capacitor chip 120 is mounted on the high-voltage die pad 222a. In the sixth embodiment, the low-voltage die pad 221a corresponds to a first die pad, and the high-voltage die pad 222a corresponds to a second die pad. The low-voltage lead 221b corresponds to a first lead, and the high-voltage lead 222b corresponds to a second lead.

In the sixth embodiment, the transformer chip 80 and the capacitor chip 120 are arranged in this order from the low-voltage leads 221b toward the high-voltage leads 222b.

In the gate driver 10, the first coils 41A and 41B (refer to FIG. 12) of the transformers 40A and 40B are electrically connected to the low-voltage circuit 20 and are connected to the ground of the low-voltage circuit 20. More specifically, each of the first coils 41A and 41B includes a first end electrically connected to the low-voltage circuit 20 and a second end connected to the ground of the low-voltage circuit 20.

The first electrode pads 81 of the transformer chip 80 are connected to the low-voltage leads 221b by a wire W. Thus, the first coil 41A of the transformer 40A is electrically connected to one of the low-voltage leads 221b. Although not shown, the first coil 41B of the transformer 40B is electrically connected to another one of the low-voltage leads 221b. Although not shown, the first coils 41A and 41B of the transformers 40A and 40B are connected by wires W to the low-voltage leads 221b integrated with the low-voltage die pad 221a.

In the gate driver 10, the second coils 42A and 42B (refer to FIG. 12) of the transformers 40A and 40B are electrically connected to the capacitors 50A and 50B and are connected to the ground of the high-voltage circuit 30. More specifically, the first ends of the second coils 42A and 42B are electrically connected to the capacitors 50A and 50B, and the second ends of the second coils 42A and 42B are connected to the ground of the high-voltage circuit 30.

The second electrode pads 82 of the transformer chip 80 are connected to the first electrode pads 121 of the capacitor chip 120 by wires W. Thus, the second coil 42A of the transformer 40A is electrically connected to the first electrode 51A of the capacitor 50A (refer to FIG. 12). Although not shown, the second coil 42B of the transformer 40B is electrically connected to the first electrode 51B of the capacitor 50B (refer to FIG. 12). Although not shown, the second coils 42A and 42B of the transformers 40A and 40B are electrically connected by wires W to the high-voltage leads 222b integrated with the high-voltage die pad 222a.

The sixth embodiment obtains the following advantages in addition to the advantages (1-1), (1-2), and (1-8) of the first embodiment.

(6-1) The transformer 40 and the capacitor 50 are included in the insulation module 220, which is a semiconductor module differing from the low-voltage circuit module 200 and the high-voltage circuit module 210.

This structure allows the low-voltage circuit module 200 and high-voltage circuit module 210, which differ from each other, to use the common insulation module 220. This reduces the costs for manufacturing different types of gate drivers that differ in at least one of the low-voltage circuit module 200 and the high-voltage circuit module 210.

Seventh Embodiment

A seventh embodiment of a gate driver 10 will be described with reference to FIGS. 14 and 15. The gate driver 10 of the seventh embodiment differs from the gate driver 10 of the second embodiment mainly in that the gate driver 10 of the sixth embodiment includes a plurality of packages. In the following description, the differences from the second embodiment will be described. The same reference characters are given to those components that are the same as the corresponding components of the gate driver 10 of the second embodiment. Such components will not be described in detail.

Figure 14:
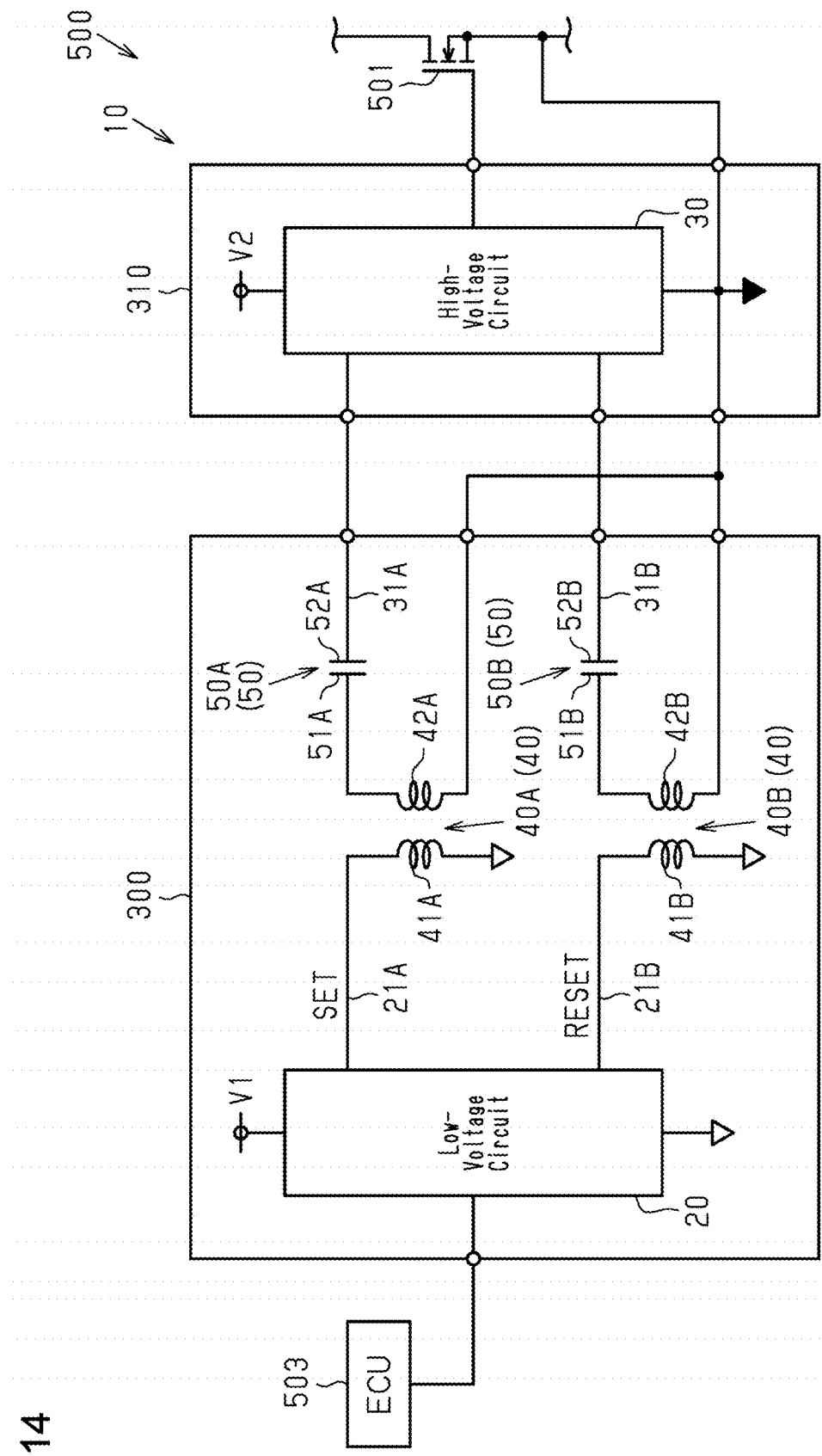
FIG. 14 is a schematic circuit diagram showing a seventh embodiment of a gate driver.

As shown in FIG. 14, the gate driver 10 of the seventh embodiment has the same circuit configuration as the gate driver 10 of the first embodiment. The gate driver 10 includes a low-voltage circuit unit 300 and a high-voltage circuit module 310. The high-voltage circuit module 310 has the same structure as the high-voltage circuit module 210 (refer to FIG. 12) of the sixth embodiment.

The low-voltage circuit unit 300 includes a low-voltage circuit 20, a transformer 40, and a capacitor 50. The low-voltage circuit unit 300 insulates the low-voltage circuit 20 from the high-voltage circuit 30 while allowing transmission of the set signal and the reset signal from the low-voltage circuit 20 to the high-voltage circuit 30.

Figure 15:
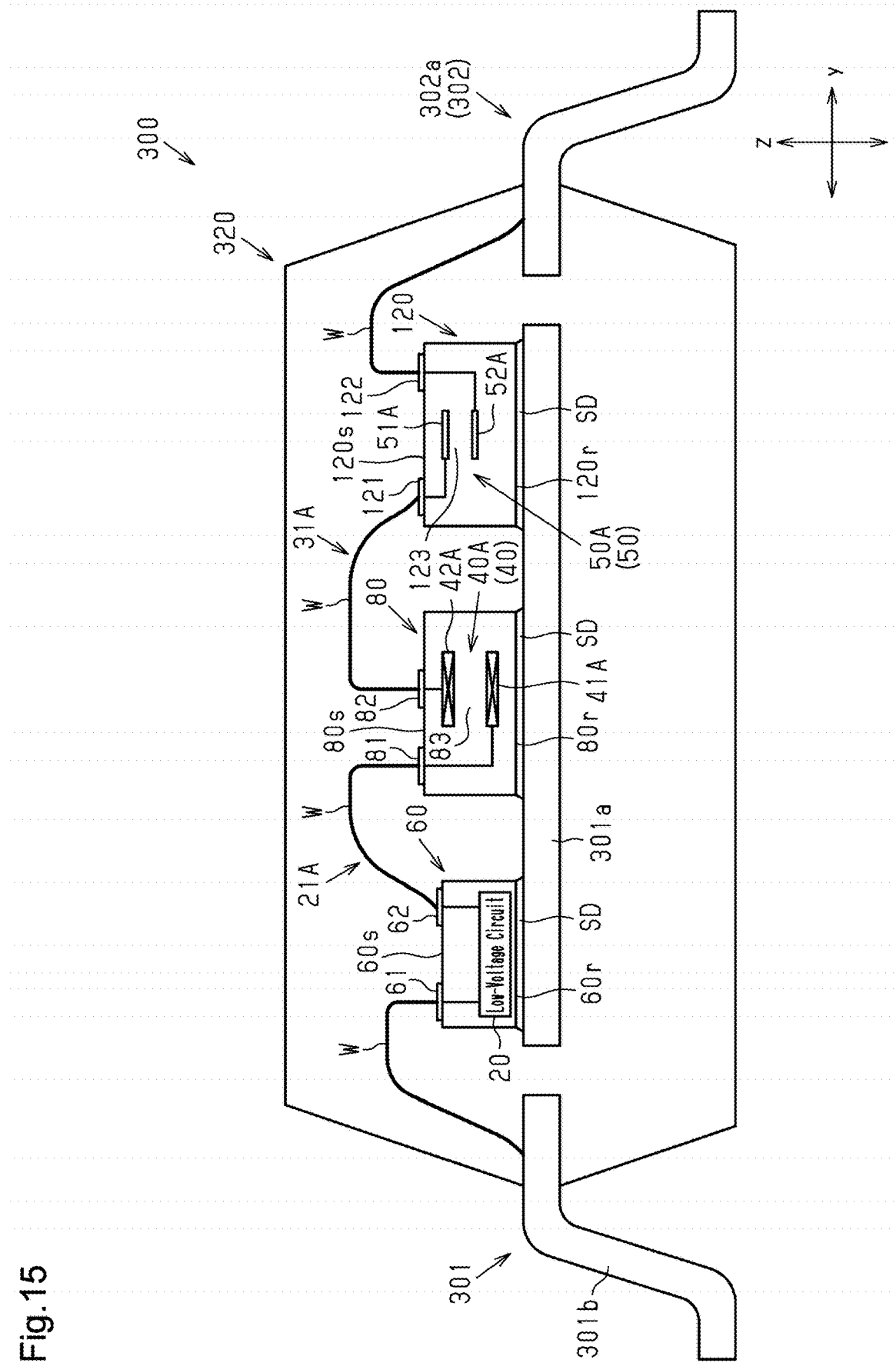
FIG. 15 is a schematic cross-sectional view showing a low-voltage circuit unit of the seventh embodiment.

FIG. 15 shows an example of a schematic cross-sectional structure of the low-voltage circuit unit 300. As shown in FIG. 15, the low-voltage circuit unit 300 includes a low-voltage circuit chip 60 including the low-voltage circuit 20, a transformer chip 80, a capacitor chip 120, a low-voltage lead frame 301, a high-voltage lead frame 302, and an encapsulation resin 320 that encapsulates the chips 60, 80, 120 and a part of each of the lead frames 301 and 302. In other words, the low-voltage circuit unit 300 includes an insulation module that includes the transformer 40 and the capacitor 50. That is, the low-voltage circuit unit 300 includes the insulation module and the low-voltage circuit 20 (refer to FIG. 14). In other words, the insulation module includes the transformer chip 80 and the capacitor chip 120.

The lead frames 301 and 302 are formed from a conductor and, in the seventh embodiment, are formed from Cu. The lead frames 301 and 302 are disposed to extend from the inside to the outside of the encapsulation resin 320.

The low-voltage lead frame 301 is electrically connected to the low-voltage circuit 20 and includes a low-voltage die pad 301a disposed in the encapsulation resin 320 and a plurality of low-voltage leads 301b disposed to extend from the inside to the outside of the encapsulation resin 320. The low-voltage leads 301b include external terminals electrically connected to the low-voltage circuit 20.

The high-voltage lead frame 302 is electrically connected to the high-voltage circuit 30 (refer to FIG. 14) and includes a plurality of high-voltage leads 302a disposed to extend from the inside to the outside of the encapsulation resin 320. The high-voltage leads 302a include external terminals electrically connected to the high-voltage circuit 30.

In the seventh embodiment, the low-voltage circuit chip 60, the transformer chip 80, and the capacitor chip 120 are mounted on the low-voltage die pad 301a. The low-voltage circuit chip 60, the transformer chip 80, and the capacitor chip 120 are spaced apart from each other in the y-direction. In the seventh embodiment, the low-voltage circuit chip 60, the transformer chip 80, and the capacitor chip 120 are arranged in this order from the low-voltage leads 301b toward the high-voltage leads 302a. In the capacitor chip 120, the second electrode 52A is separated from the low-voltage die pad 301a by a distance sufficient to maintain insulation between the capacitor chip 120 and the low-voltage die pad 301a.

The low-voltage circuit chip 60, the transformer chip 80, and the capacitor chip 120 are connected by wires W in the same manner as those of the second embodiment. The second electrode pads 122 of the capacitor chip 120 are connected to a plurality of high-voltage leads 302a by wires W. The seventh embodiment obtains the advantages (1-1), (1-2), and (1-8) of the first embodiment.

Eighth Embodiment

An eighth embodiment of a gate driver 10 will be described with reference to FIGS. 16 and 17. The gate driver 10 of the eighth embodiment differs from the gate driver 10 of the second embodiment mainly in that the gate driver 10 of the eighth embodiment includes a plurality of packages. In the following description, the differences from the second embodiment will be described. The same reference characters are given to those components that are the same as the corresponding components of the gate driver 10 of the second embodiment. Such components will not be described in detail.

Figure 16:
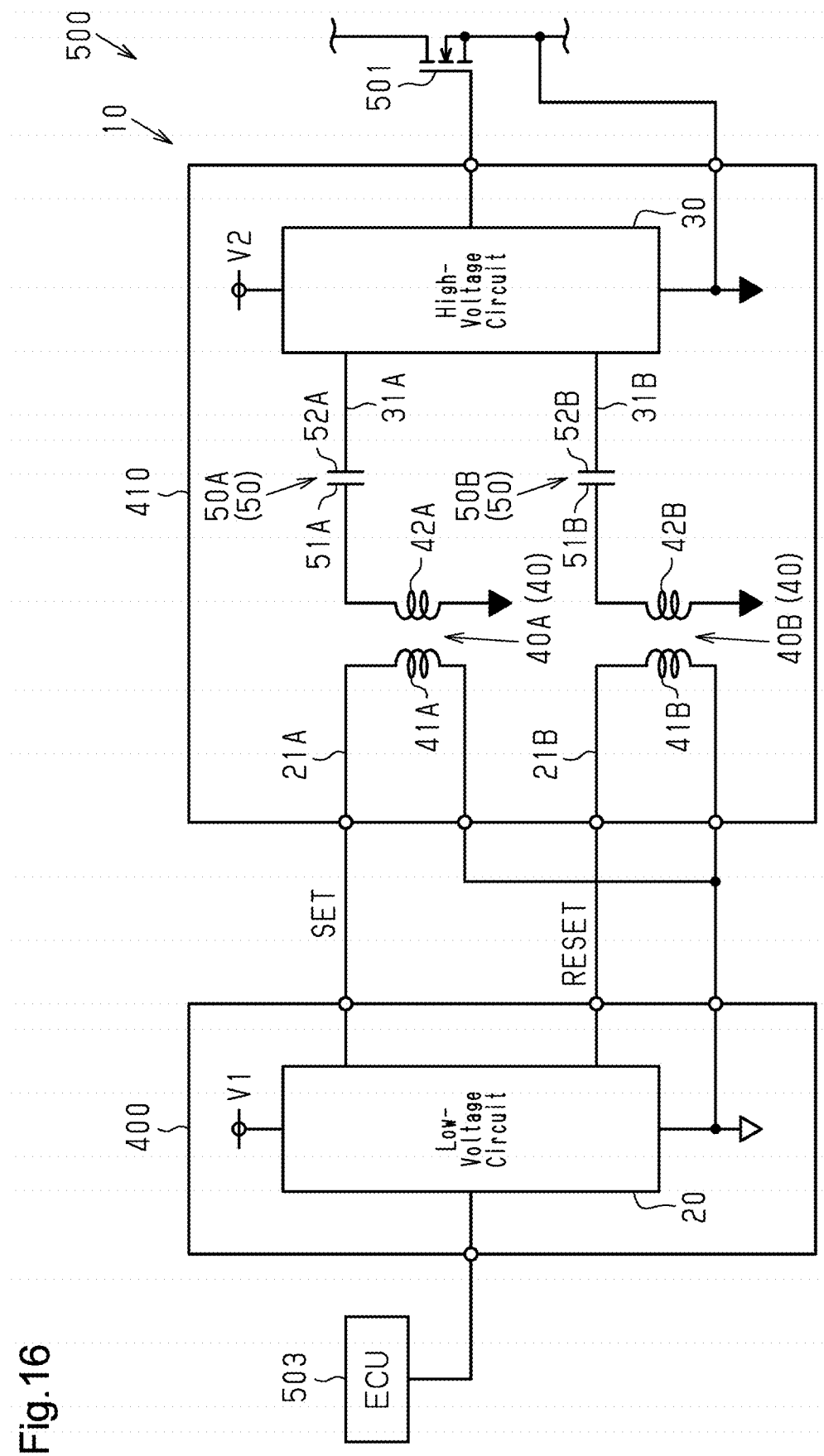
FIG. 16 is a schematic circuit diagram showing an eighth embodiment of a gate driver.

As shown in FIG. 16, the gate driver 10 of the eighth embodiment has the same circuit configuration as the gate driver 10 of the first embodiment. The gate driver 10 includes a low-voltage circuit module 400 and a high-voltage circuit unit 410. The low-voltage circuit module 400 has the same structure as the low-voltage circuit module 200 (refer to FIG. 12) of the sixth embodiment.

The high-voltage circuit unit 410 includes a high-voltage circuit 30, a transformer 40, and a capacitor 50. The high-voltage circuit unit 410 insulates the low-voltage circuit 20 from the high-voltage circuit 30 while allowing transmission of the set signal and the reset signal from the low-voltage circuit 20 to the high-voltage circuit 30.

Figure 17:
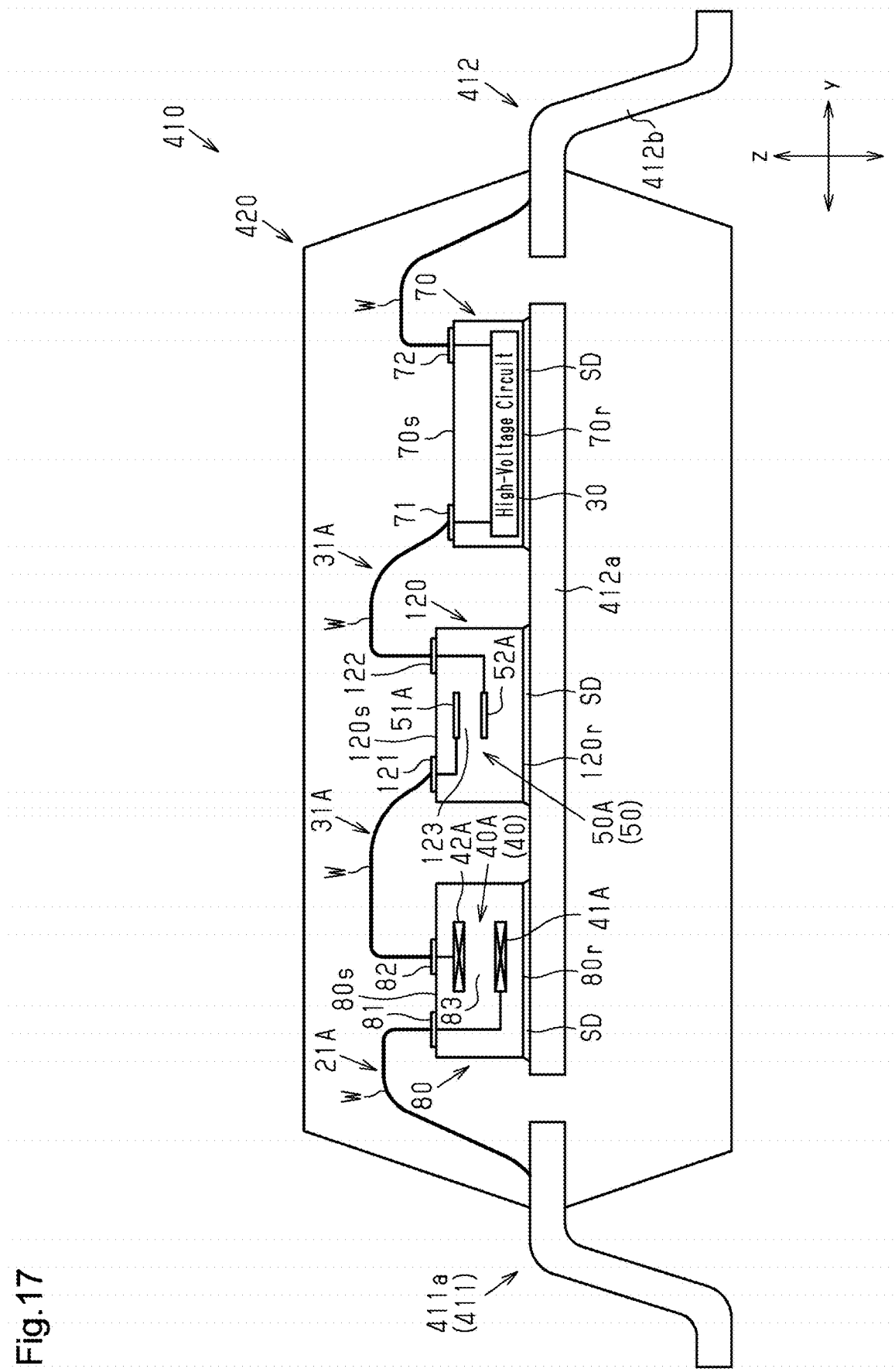
FIG. 17 is a schematic cross-sectional view showing a high-voltage circuit unit of the eighth embodiment.

FIG. 17 shows an example of a schematic cross-sectional structure of the high-voltage circuit unit 410. As shown in FIG. 17, the high-voltage circuit unit 410 includes a high-voltage circuit chip 70, a transformer chip 80, a capacitor chip 120, a low-voltage lead frame 411, a high-voltage lead frame 412, and an encapsulation resin 420 that encapsulates the chips 70, 80, and 120 and a part of each of the lead frames 411 and 412. In other words, the high-voltage circuit unit 410 includes an insulation module that includes the transformer 40 and the capacitor 50. That is, the high-voltage circuit unit 410 includes the insulation module and the high-voltage circuit 30 (refer to FIG. 16). In other words, the insulation module includes the transformer chip 80 and the capacitor chip 120.

The lead frames 411 and 412 are formed from a conductor and, in the eighth embodiment, are formed from Cu. The lead frames 411 and 412 are disposed to extend from the inside to the outside of the encapsulation resin 420.

The low-voltage lead frame 411 is electrically connected to the low-voltage circuit 20 (refer to FIG. 16) and includes a plurality of low-voltage leads 411a disposed to extend from the inside to the outside of the encapsulation resin 420. The low-voltage leads 411a include external terminals electrically connected to the low-voltage circuit 20.

The high-voltage lead frame 412 is electrically connected to the high-voltage circuit 30 and includes a high-voltage die pad 412a disposed in the encapsulation resin 420 and a plurality of high-voltage leads 412b disposed to extend from the inside to the outside of the encapsulation resin 420. The high-voltage leads 412b include external terminals electrically connected to the high-voltage circuit 30.

In the eighth embodiment, the high-voltage circuit chip 70, the transformer chip 80, and the capacitor chip 120 are mounted on the high-voltage die pad 412a. The high-voltage circuit chip 70, the transformer chip 80, and the capacitor chip 120 are spaced apart from each other in the y-direction. In the eighth embodiment, the transformer chip 80, the capacitor chip 120, and the high-voltage circuit chip 70 are arranged in this order from the low-voltage lead 411a toward the high-voltage lead 412b. In the transformer chip 80, the first coil 41A is separated from the high-voltage die pad 412a by a distance sufficient to maintain insulation between the transformer chip 80 and the high-voltage die pad 412a even when the second reference potential of the high-voltage die pad 412a fluctuates and becomes high.

The high-voltage circuit chip 70, the transformer chip 80, and the capacitor chip 120 are connected by wires W in the same manner as those of the second embodiment. The first electrode pads 81 of the transformer chip 80 are connected to the low-voltage leads 411a by wires W. The eighth embodiment obtains the advantages (1-1), (1-2), and (1-8) of the first embodiment.

Modified Examples

The above embodiments exemplify, without any intention to limit, applicable forms of a gate driver, an insulation module, a low-voltage circuit unit, and a high-voltage circuit unit according to the present disclosure. The gate driver, the insulation module, the low-voltage circuit unit, and the high-voltage circuit unit according to the present disclosure can be applicable to forms differing from the above embodiments. In an example of such a form, the structure of the embodiments is partially replaced, changed, or omitted, or a further structure is added to the embodiments. The modified examples described below may be combined with one another as long as there is no technical inconsistency. In the modified examples, the same reference characters are given to those components that are the same as the corresponding components of the above embodiments. Such components will not be described in detail.

In the first and second embodiments, the transformer chip 80 is arranged separately from the low-voltage circuit chip 60 and the high-voltage circuit chip 70. However, there is no limit to such arrangement. In an example, the transformer 40 may be incorporated into the low-voltage circuit chip 60.

When the transformer 40 is incorporated in the low-voltage circuit chip 60, for example, the transformer 40 is arranged in the low-voltage circuit chip 60 near the high-voltage circuit chip 70 in the y-direction. In plan view, the transformer 40 is disposed to overlap the low-voltage circuit 20. In this case, the transformer 40 is disposed closer to the chip main surface 60s of the low-voltage circuit chip 60 than the low-voltage circuit 20.

With this structure, the number of semiconductor chips in the gate driver 10 is reduced, thereby reducing the space for arranging the semiconductor chips in the arrangement direction (y-direction) of the semiconductor chips. Accordingly, the encapsulation resin 110 is reduced in size in the y-direction. As a result, the gate driver 10 is reduced in size.

In the third and fourth embodiments, in the same manner, the transformer 40 may be incorporated in the high-voltage circuit chip 70 instead of the transformer chip 80. The structure in which the transformer 40 is incorporated into the high-voltage circuit chip 70 is the same as the structure in which the transformer 40 is incorporated into the low-voltage circuit chip 60.

Figure 18:
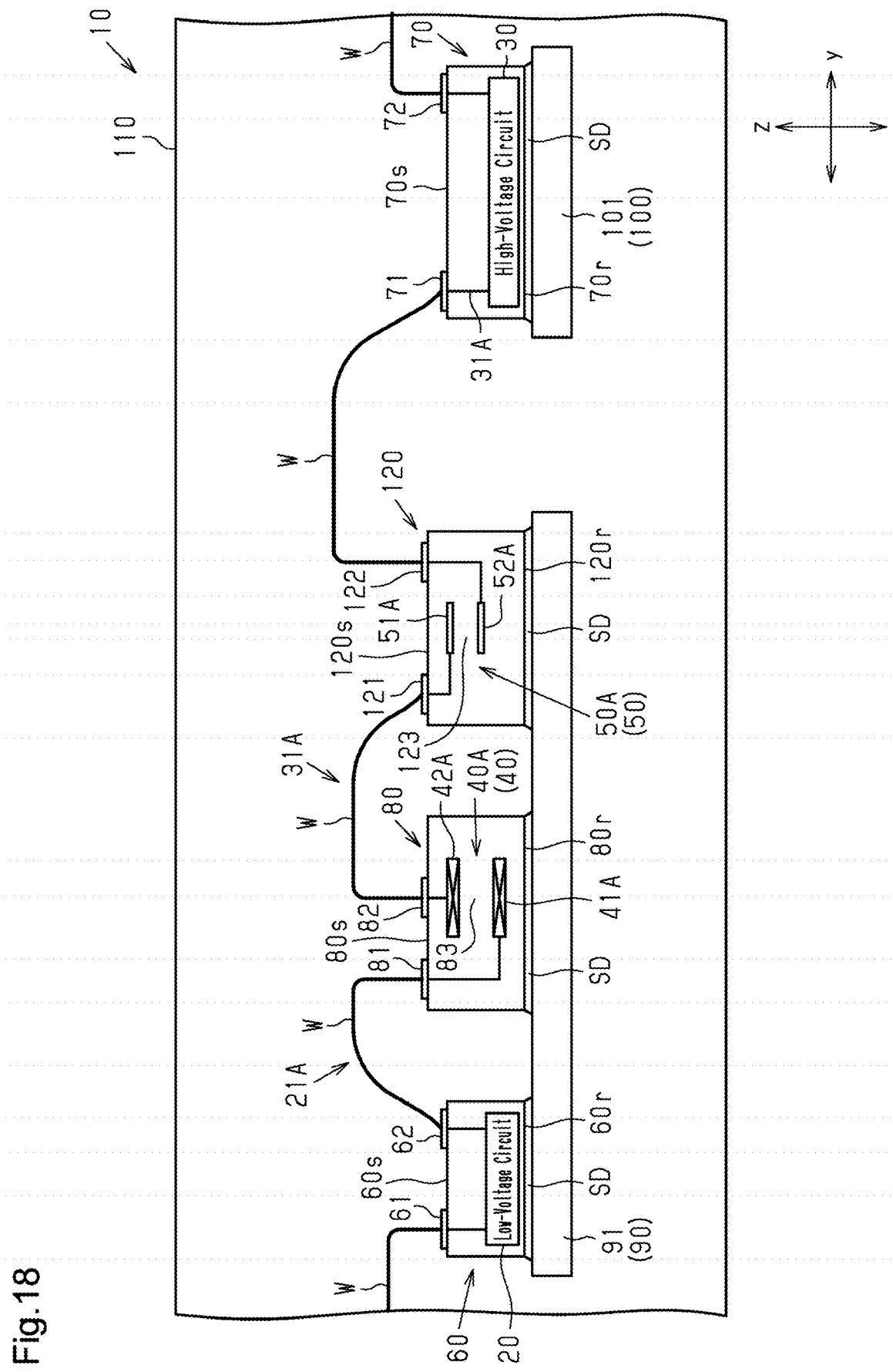
FIG. 18 is a schematic cross-sectional view showing a modified example of a gate driver.

In the second embodiment, as shown in FIG. 18, the capacitor chip 120 may be mounted on the low-voltage die pad 91. That is, the transformer chip 80 and the capacitor chip 120 may be mounted on the low-voltage die pad 91. In the capacitor chip 120, the second electrode 52A is separated from the low-voltage die pad 91 by a distance sufficient to maintain insulation between the capacitor chip 120 and the low-voltage die pad 91.

Figure 19:
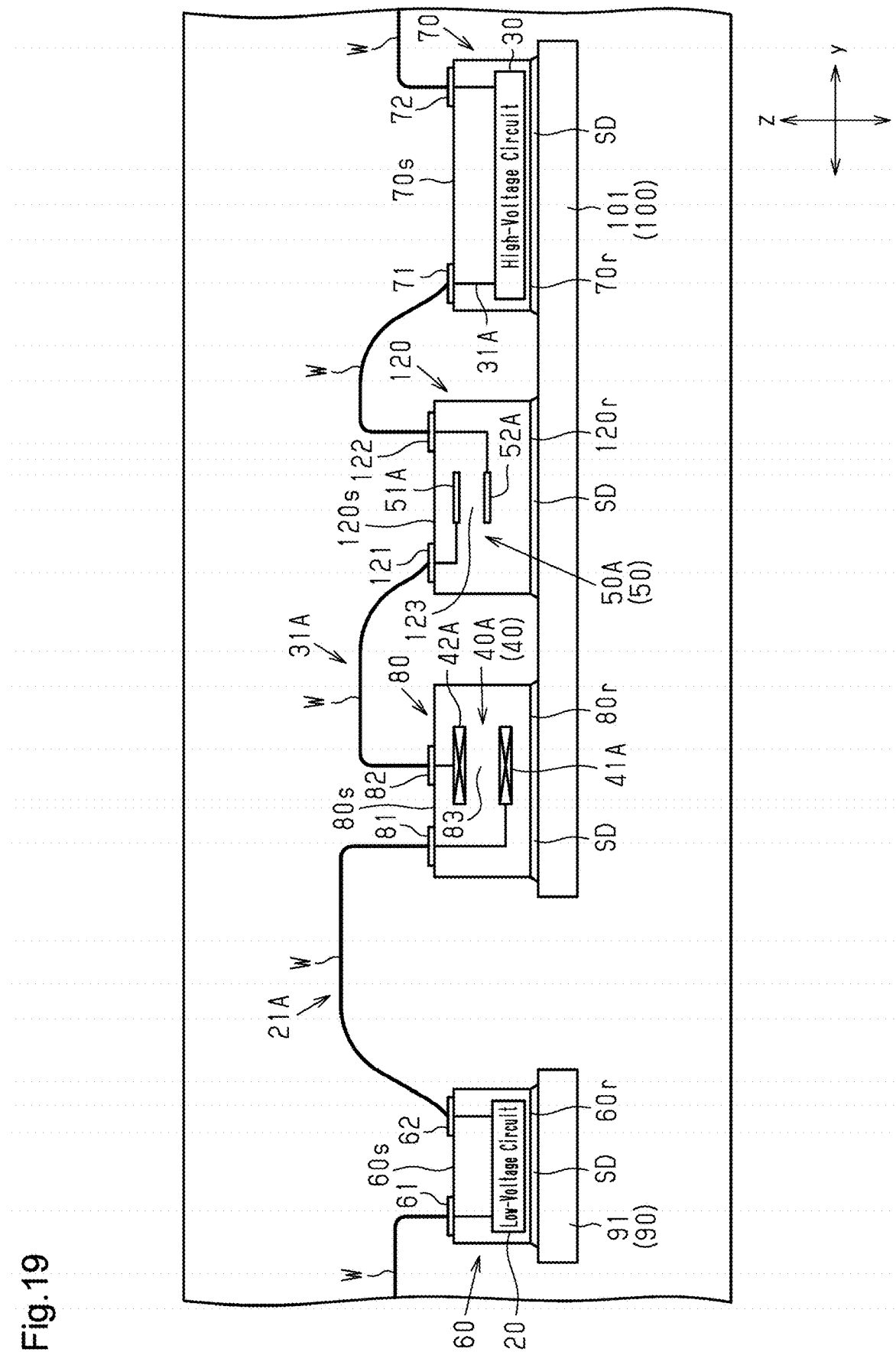
FIG. 19 is a schematic cross-sectional view showing a modified example of a gate driver.

In the second embodiment, as shown in FIG. 19, the transformer chip 80 may be mounted on the high-voltage die pad 101. That is, the transformer chip 80 and the capacitor chip 120 may be mounted on the high-voltage die pad 101. In the transformer chip 80, the first coil 41A is separated from the high-voltage die pad 101 by a distance sufficient to maintain insulation between the transformer chip 80 and the high-voltage die pad 101 even when the second reference potential of the high-voltage die pad 101 fluctuates and becomes high.

Figure 20:
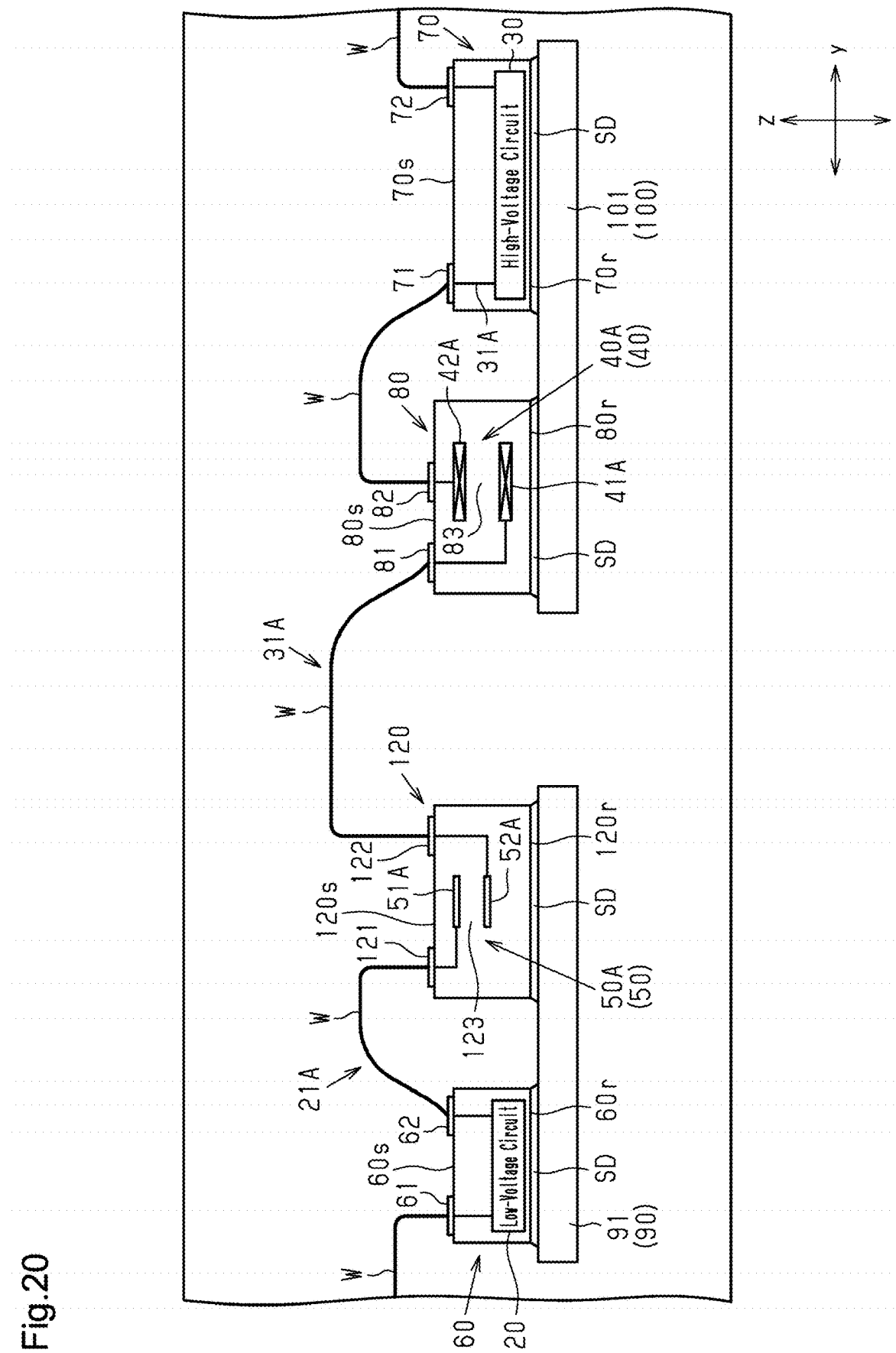
FIG. 20 is a schematic cross-sectional view showing a modified example of a gate driver.

In the fourth embodiment, as shown in FIG. 20, the transformer chip 80 may be mounted on the high-voltage die pad 101. That is, the capacitor chip 120 may be mounted on the low-voltage die pad 91, and the transformer chip 80 may be mounted on the high-voltage die pad 101.

In the fourth embodiment, the capacitor chip 120 and the transformer chip 80 may be mounted on the high-voltage die pad 101. In the capacitor chip 120, the second electrode 52A is separated from the high-voltage die pad 101 by a distance sufficient to maintain insulation between the capacitor chip 120 and the high-voltage die pad 101 even when the second reference potential of the high-voltage die pad 101 fluctuates and becomes high.

In the fifth embodiment, both the first transformer chip 80A and the second transformer chip 80B may be mounted on the low-voltage die pad 91. In the second transformer chip 80B, the second coil 48A is separated from the low-voltage die pad 91 by a distance sufficient to maintain insulation between the second transformer chip 80B and the low-voltage die pad 91.

In the fifth embodiment, the first transformer chip 80A and the second transformer chip 80B may be mounted on the high-voltage die pad 101. In the first transformer chip 80A, the first coil 45A is separated from the high-voltage die pad 101 by a distance sufficient to maintain insulation between the first transformer chip 80A and the high-voltage die pad 101 even when the second reference potential of the high-voltage die pad 101 fluctuates and becomes high.

In the fifth embodiment, the first transformers 43A and 43B may be incorporated in the low-voltage circuit chip 60.

In the fifth embodiment, the second transformers 44A and 44B may be incorporated in the high-voltage circuit chip 70.

The structure of the transformer 40 of the fifth embodiment may be combined with each of the second to fourth embodiments and each modified example of the second to fourth embodiments. In addition, the structure of the transformer 40 of the fifth embodiment may be combined with each of the sixth to eighth embodiments and each modified example of the sixth to eighth embodiments as described below.

In a first example, in the fifth embodiment, while the capacitor 50 is omitted from the high-voltage circuit chip 70, the gate driver 10 may include a capacitor chip 120 that includes the capacitor 50. In this case, the low-voltage circuit chip 60, the first transformer chip 80A, the second transformer chip 80B, the capacitor chip 120, and the high-voltage circuit chip 70 may be arranged in this order from the low-voltage leads 92 toward the high-voltage leads 102.

In a second example, in the fifth embodiment, the capacitor 50A may be disposed between the low-voltage circuit 20 and the transformer 40 in the circuitry. More specifically, the first electrode 51A of the capacitor 50A is electrically connected to the low-voltage circuit 20, and the second electrode 52A of the capacitor 50A is electrically connected to the first transformer 43A. The capacitor 50A is connected in series to the first transformer 43A. The transformer 40B and the capacitor 50B are the same as the transformer 40A and the capacitor 50A.

In the second example, the capacitor 50 may be incorporated in the low-voltage circuit chip 60.

In the second example, the first transformer chip 80A may be mounted on the low-voltage die pad 91, and the second transformer chip 80B may be mounted on the high-voltage die pad 101.

In the second example, both the first transformer chip 80A and the second transformer chip 80B may be mounted on the low-voltage die pad 91 or the high-voltage die pad 101. When both the first transformer chip 80A and the second transformer chip 80B are mounted on the low-voltage die pad 91, in the second transformer chip 80B, the second coil 48A is separated from the low-voltage die pad 91 by a distance sufficient to maintain insulation between the second transformer chip 80B and the low-voltage die pad 91. When both the first transformer chip 80A and the second transformer chip 80B are mounted on the high-voltage die pad 101, in the first transformer chip 80A, the first coil 45A is separated from the high-voltage die pad 101 by a distance sufficient to maintain insulation between the first transformer chip 80A and the high-voltage die pad 101 even when the second reference potential of the high-voltage die pad 101 fluctuates and becomes high.

In the second example, the gate driver 10 may include the capacitor chip 120 including the capacitor 50. In this case, the low-voltage circuit chip 60, the capacitor chip 120, the first transformer chip 80A, the second transformer chip 80B, and the high-voltage circuit chip 70 may be arranged in this order from the low-voltage leads 92 toward the high-voltage leads 102.

In the sixth embodiment, the transformer chip 80 and the capacitor chip 120 are separately mounted on separate die pads. Instead, the transformer chip 80 and the capacitor chip 120 may be mounted on a common die pad. In this case, the insulation module 220 includes the common die pad on which the transformer chip 80 and the capacitor chip 120 are mounted, a first lead electrically connected to the transformer 40, and a second lead electrically connected to the capacitor 50. The transformer chip 80 is connected to the first lead by a wire so that the transformer 40 is electrically connected to the first lead. Also, the capacitor chip 120 is connected to the second lead by a wire so that the capacitor 50 is electrically connected to the second lead.

In the sixth embodiment, when the capacitor 50 is disposed between the low-voltage circuit 20 and the transformer 40 in the circuitry, the transformer chip 80 may be mounted on the high-voltage die pad 222a and the capacitor chip 120 may be mounted on the low-voltage die pad 221a. In this case, the high-voltage die pad 222a corresponds to a first die pad, and the low-voltage die pad 221a corresponds to a second die pad. The high-voltage lead 222b corresponds to a first lead, and the low-voltage lead 221b corresponds to a second lead.

In the seventh embodiment, the low-voltage circuit unit 300 may have the structure and arrangement of the chips 60, 80, and 120 of the first to fifth embodiments. In an example, high-voltage lead frame 302 may include a high-voltage die pad. In this case, the low-voltage circuit chip 60 and the transformer chip 80 may be mounted on the low-voltage die pad 301a, and the capacitor chip 120 may be mounted on the high-voltage die pad.

In the eighth embodiment, the high-voltage circuit unit 410 may have the structure and arrangement of the chips 70, 80, 120 of the first to fifth embodiments. In an example, the low-voltage lead frame 411 may include a low-voltage die pad. In this case, the high-voltage circuit chip 70 and the capacitor chip 120 may be mounted on the high-voltage die pad 412a, and the transformer chip 80 may be mounted on the low-voltage die pad.

In the first to third embodiments, the transformer chip 80 may be mounted on the high-voltage die pad 101 of the high-voltage lead frame 100. In the transformer chip 80, the first coil 41A is separated from the high-voltage die pad 101 by a distance sufficient to maintain insulation between the transformer chip 80 and the high-voltage die pad 101 even when the second reference potential of the high-voltage die pad 101 fluctuates and becomes high.

In each embodiment, the gate driver 10 includes the signal path for transmitting the set signal and the signal path for transmitting the reset signal. Instead, the set signal and the reset signal may be transmitted through a common signal path. That is, the gate driver 10 may include a single signal path for transmitting signals that drive the switching element 501.

In each embodiment, the number of capacitors 50A connected in series to the transformer 40A and the number of capacitors 50B connected in series to the transformer 40B may be changed in any manner. In an example, a plurality of capacitors 50A may be provided and connected to each other in series. A plurality of capacitors 50B may be provided and connected to each other in series. As described above, a plurality of capacitors 50 connected in series may be provided.

This structure increases the number of capacitors 50 connected in series, thereby improving the insulation voltage of the gate driver 10 when dielectric breakdown occurs in the transformer 40 due to a short circuit between the first coil 41A (41B) and the second coil 42A (42B).

In each embodiment, capacitors 50 may be disposed between the low-voltage circuit 20 and the transformer 40 and between the transformer 40 and the high-voltage circuit 30 in the circuitry. Each of the capacitors 50 is connected in series to the transformer 40.

Figure 21:
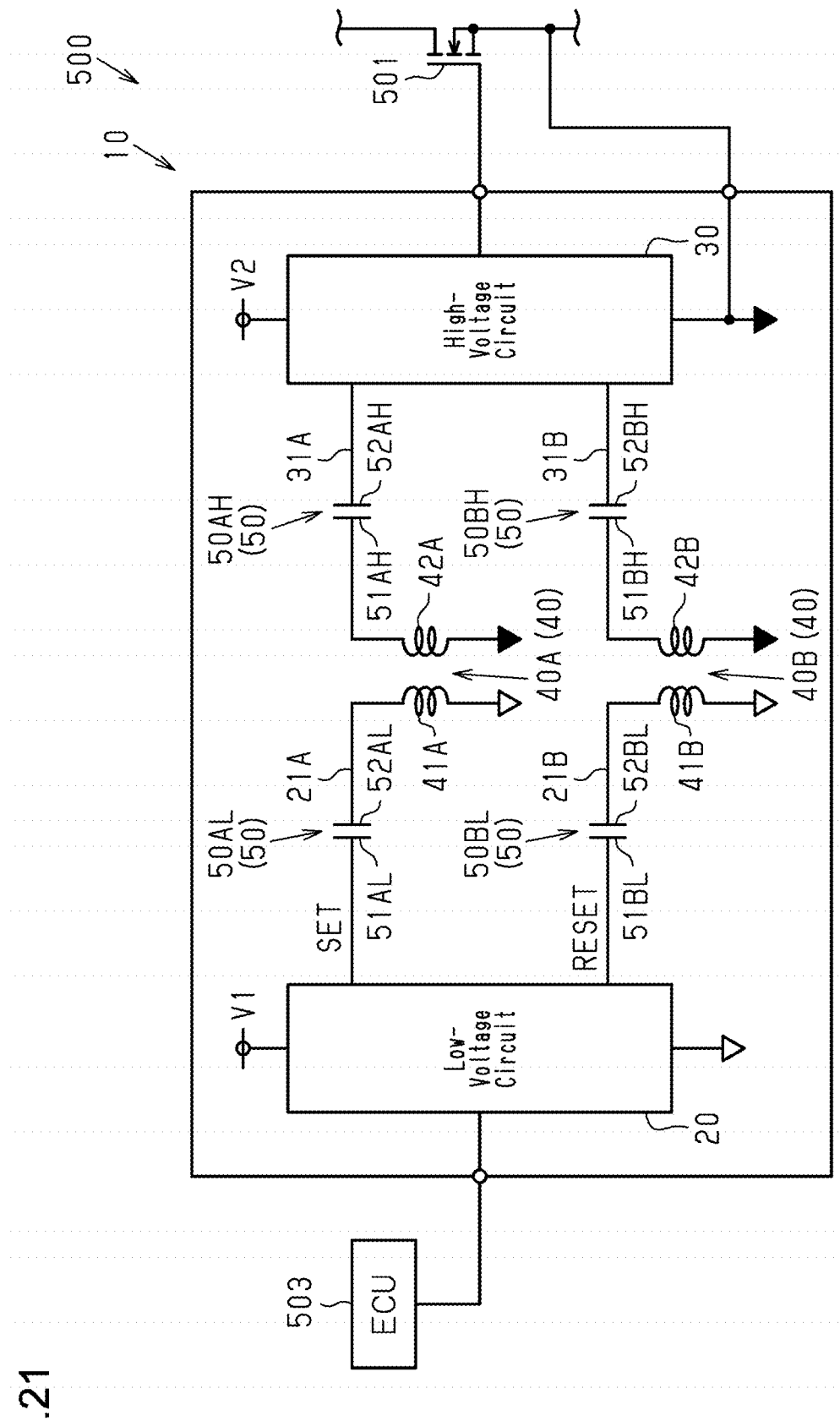
FIG. 21 is a schematic circuit diagram showing a modified example of a gate driver.

In an example, as shown in FIG. 21, the capacitors 50 include low-voltage capacitors 50AL and 50BL disposed between the low-voltage circuit 20 and the transformer 40 and high-voltage capacitors 50AH and 50BH disposed between the transformer 40 and the high-voltage circuit 30.

The low-voltage capacitor 50AL includes a first electrode 51AL and a second electrode 52AL. The first electrode 51AL is electrically connected to the low-voltage circuit 20. The second electrode 52AL is electrically connected to the transformer 40A. The second electrode 52AL is electrically connected to the first coil 41A of the transformer 40A. Thus, the low-voltage circuit 20 and the transformer 40A are electrically connected to each other through the low-voltage capacitor 50AL. The first electrode 51AL corresponds to a first low-voltage electrode. The second electrode 52AL corresponds to a second low-voltage electrode.

The high-voltage capacitor 50AH includes a first electrode 51AH and a second electrode 52AH. The first electrode 51AH is electrically connected to the transformer 40A. The second electrode 52AH is electrically connected to the high-voltage circuit 30. The first electrode 51AH is electrically connected to the second coil 42A of the transformer 40A. In other words, the transformer 40A and the high-voltage circuit 30 are electrically connected to each other through the high-voltage capacitor 50AH. The first electrode 51AH correspond to a first high-voltage electrode. The second electrodes 52AH correspond to a second high-voltage electrode.

The low-voltage capacitor 50BL includes a first electrode 51BL and a second electrode 52BL. The high-voltage capacitor 50BH includes a first electrode 51BH and a second electrode 52BH. The connection structure of the capacitors 50BL and 50BH to the low-voltage circuit 20, the transformer 40, and the high-voltage circuit 30 is the same as that of the capacitors 50AL and 50AH and thus will not be described in detail. The first electrode 51BL corresponds to a first low-voltage electrode. The second electrode 52BL corresponds to a second low-voltage electrode. The first electrode 51BH corresponds to a first high-voltage electrode. The second electrode 52BH corresponds to a second high-voltage electrode.

With this structure, when dielectric breakdown occurs in the transformer 40 due to a short circuit between the first coil 41A (41B) and the second coil 42A (42B), the high-voltage circuit 30 and the low-voltage circuit 20 are insulated from each other by the high-voltage capacitors 50AH and 50BH and the low-voltage capacitors 50AL and 50BL. Thus, insulation between the low-voltage circuit 20 and the high-voltage circuit 30 is likely to be maintained. In addition, the breakdown voltage of each of the capacitors 50AL, 50AH, 50BL, and 50BH may be decreased.

Figure 22:
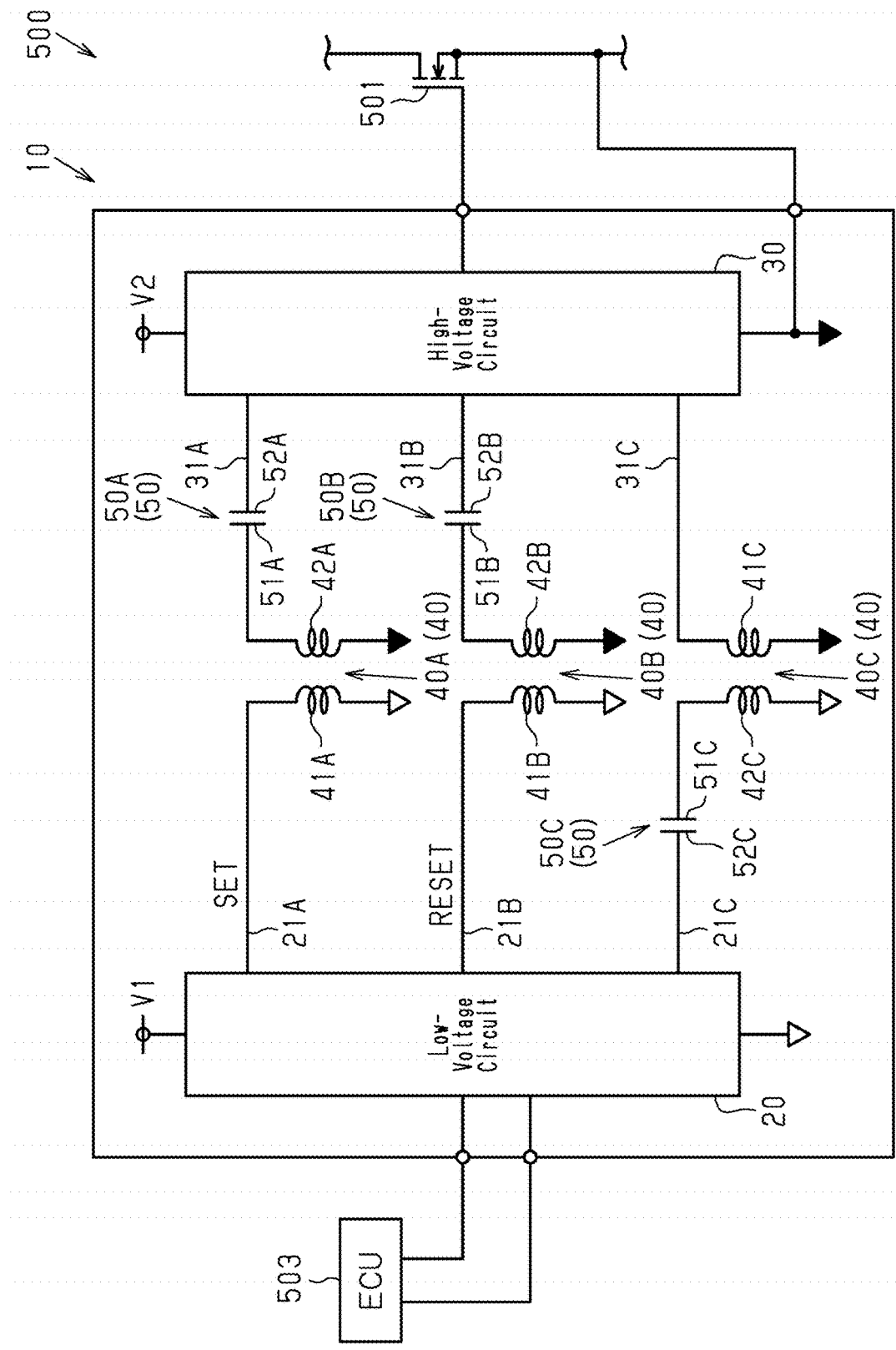
FIG. 22 is a schematic circuit diagram showing a modified example of a gate driver.

In each embodiment, the gate driver 10 may include a signal path that transmits a signal from the high-voltage circuit 30 to the low-voltage circuit 20. As shown in FIG. 22, an example of a structure in which the gate driver 10 of the first embodiment further includes a signal path for transmitting a signal from the high-voltage circuit 30 to the low-voltage circuit 20 will be described.

As shown in FIG. 22, the first electrode MA of the capacitor 50A is electrically connected to the transformer 40A, and the second electrode 52A of the capacitor 50A is electrically connected to the high-voltage circuit 30. The first electrode MB of the capacitor 50B is electrically connected to the transformer 40B, and the second electrode 52B of the capacitor 50B is electrically connected to the high-voltage circuit 30. Thus, the transformers 40A and 40B each correspond to a first transformer, and the capacitors 50A and 50B each correspond to a first capacitor. In other words, the first electrode of the first capacitor is electrically connected to the first transformer, and the second electrode of the first capacitor is electrically connected to the high-voltage circuit.

The set signal output from the low-voltage circuit 20 is transmitted through the transformer 40A and the capacitor 50A to the high-voltage circuit 30. The reset signal output from the low-voltage circuit 20 is transmitted through the transformer 40B and the capacitor 50B to the high-voltage circuit 30. In other words, a first signal output from the low-voltage circuit is transmitted through the first transformer and the first capacitor to the high-voltage circuit.

As shown in FIG. 22, the gate driver 10 further includes a transformer 40C, a capacitor 50C, a low-voltage signal line 21C, and a high-voltage signal line 31C. The capacitor 50C is connected in series to the transformer 40C. The transformer 40C corresponds to a second transformer, and the capacitor 50C corresponds to a second capacitor.

The transformer 40C insulates the high-voltage circuit 30 from the low-voltage circuit 20 while transmitting a signal from the high-voltage circuit 30 toward the low-voltage circuit 20. In an example, the signal is for detecting an anomaly in the temperature of the switching element 501 and corresponds to a second signal. The transformer 40C includes a first coil 41C and a second coil 42C that is insulated from and configured to be magnetically coupled to the first coil 41C.

The first coil 41C is electrically connected to the high-voltage circuit 30 and is also electrically connected to the ground of the high-voltage circuit 30. More specifically, the first coil 41C includes a first end electrically connected to the high-voltage circuit 30 through the capacitor 50C and a second end electrically connected to the ground of the high-voltage circuit 30. Thus, the potential of the second end of the first coil 41C equals the second reference potential. The second reference potential varies as the inverter device 500 is driven and is, for example, greater than or equal to 600 V.

The second coil 42C is electrically connected to the capacitor 50C and is also electrically connected to the ground of the low-voltage circuit 20. More specifically, the second coil 42C includes a first end electrically connected to the capacitor 50C and a second end electrically connected to the ground of the low-voltage circuit 20. Thus, the potential of the second end of the second coil 42C equals the first reference potential. The first reference potential is, for example, 0 V.

The capacitor 50C includes a first electrode 51C and a second electrode 52C and is electrically connected to the low-voltage circuit 20 and the transformer 40C by the high-voltage signal line 31C. More specifically, the first electrode 51C of the capacitor 50C is connected to the first end of the first coil 41C of the transformer 40C, and the second electrode 52C of the capacitor 50C is connected to the low-voltage circuit 20. In other words, the first electrode of the second capacitor is electrically connected to the first transformer, and the second electrode of the second capacitor is electrically connected to the low-voltage circuit.

The signal (second signal) output from the high-voltage circuit 30 is transmitted through the transformer 40C and the capacitor 50C to the low-voltage circuit 20. In the illustrated example, the transformer 40C and the capacitor 50C are arranged in this order in the transmission direction of the signal (second signal).

As described above, in the modified example shown in FIG. 22, the signals are transmitted bidirectionally between the low-voltage circuit 20 and the high-voltage circuit 30. The signals include a first signal transmitted from the low-voltage circuit 20 toward the high-voltage circuit 30 and a second signal transmitted from the high-voltage circuit 30 toward the low-voltage circuit 20.

In the gate driver 10 shown in FIG. 22, the transformer 40C may be connected to the low-voltage circuit 20, and the capacitor 50C may be connected to the high-voltage circuit 30. That is, the capacitor 50C and the transformer 40C may be arranged in this order in the transmission direction of the signal (second signal).

In the modified example shown in FIG. 22, the capacitor 50C may be included in the low-voltage circuit chip 60. The capacitor 50C may be included in a capacitor chip. In this case, the capacitor chip is, for example, mounted on a low-voltage die pad.

The transformer 40C may be included in the transformer chip 80 or a transformer chip arranged separately from the transformer chip 80. The separate transformer chip is, for example, mounted on the low-voltage die pad 91. When the configuration of the modified example shown in FIG. 22 is applied to the third and fifth embodiments, the capacitor 50C and the transformer 40C may be changed in the same manner.

When the configuration of the modified example shown in FIG. 22 is applied to the second embodiment, the capacitor 50C is included in a capacitor chip arranged separately from the capacitor chip 120. The separate capacitor chip is, for example, mounted on the low-voltage die pad 91.

When the configuration of the modified example shown in FIG. 22 is applied to the fourth embodiment, the capacitor 50C may be included in the capacitor chip 120. Alternatively, the capacitor 50C may be included in a capacitor chip arranged separately from the capacitor chip 120. The separate capacitor chip is, for example, mounted on the low-voltage die pad 91.

The transformer 40C may be included in the transformer chip 80. Alternatively, the transformer 40C may be included in a transformer chip arranged separately from the transformer chip 80. The separate transformer chip is, for example, mounted on the low-voltage die pad 91.

When the configuration of the modified example shown in FIG. 22 is applied to the sixth to eighth embodiments, the capacitor 50C may be included in a capacitor chip arranged separately from the capacitor chip 120. The separate capacitor chip is, for example, mounted on the low-voltage die pad 91.

The transformer 40C may be included in a transformer chip arranged separately from the transformer chip 80. The separate transformer chip is, for example, mounted on the high-voltage die pad 101.

In the embodiments, the transformer 40 is a base insulation, and the capacitor 50 is an additional insulation. Alternatively, the capacitor 50 may be a base insulation, and the transformer 40 may be an additional insulation.

CLAUSES

The technical aspects that are understood from the embodiments and the modified examples will be described below.

[Clause A1] A gate driver that is configured to apply a drive voltage signal to a gate of a switching element, the gate driver including: a low-voltage circuit configured to be actuated by application of a first voltage; a high-voltage circuit configured to be actuated by application of a second voltage that is higher than the first voltage; a transformer; and a capacitor connected in series to the transformer, where the low-voltage circuit and the high-voltage circuit are connected by the transformer and the capacitor and configured to transmit a signal through the transformer and the capacitor.

[Clause A2] The gate driver according to clause A1, where the transformer includes a first transformer and a second transformer that are connected in series, the second transformer connects the first transformer and the high-voltage circuit, the capacitor includes a first electrode and a second electrode, the first electrode is electrically connected to the second transformer, and the second electrode is electrically connected to the high-voltage circuit and connected in series to the second transformer.

[Clause A3] The gate driver according to clause A2, further including a high-voltage circuit chip that includes the high-voltage circuit, where the capacitor is incorporated in the high-voltage circuit chip.

[Clause A4] The gate driver according to clause A3, further including: a low-voltage circuit chip that includes the low-voltage circuit; a first transformer chip that includes the first transformer; a second transformer chip that includes the second transformer; a low-voltage die pad on which the low-voltage circuit chip is mounted; and a high-voltage die pad on which the high-voltage circuit chip is mounted, where the first transformer chip is mounted on the low-voltage die pad, and the second transformer chip is mounted on the high-voltage die pad.

[Clause A5] The gate driver according to clause A3, further including: a low-voltage circuit chip that includes the low-voltage circuit; a first transformer chip that includes the first transformer; a second transformer chip that includes the second transformer; a low-voltage die pad on which the low-voltage circuit chip is mounted; and a high-voltage die pad on which the high-voltage circuit chip is mounted, where both the first transformer chip and the second transformer chip are mounted on the low-voltage die pad or the high-voltage die pad.

[Clause A6] The gate driver according to clause A2, further including: a low-voltage circuit chip that includes the low-voltage circuit; and a high-voltage circuit chip that includes the high-voltage circuit, a first transformer chip that includes the first transformer; a second transformer chip that includes the second transformer; and a capacitor chip that includes the capacitor, where the low-voltage circuit chip, the first transformer chip, the second transformer chip, the capacitor chip, and the high-voltage circuit chip are arranged in this order.

[Clause A7] The gate driver according to clause A1, where the transformer includes a first transformer and a second transformer that are connected in series, the first transformer connects the second transformer and the low-voltage circuit, the capacitor includes a first electrode and a second electrode, the first electrode is electrically connected to the first transformer, and the second electrode is electrically connected to the low-voltage circuit and connected in series to the first transformer.

[Clause A8] The gate driver according to clause A7, further including a low-voltage circuit chip that includes the low-voltage circuit, where the capacitor is incorporated in the low-voltage circuit chip.

[Clause A9] The gate driver according to clause A8, further including: a high-voltage circuit chip that includes the high-voltage circuit, a first transformer chip that includes the first transformer; a second transformer chip that includes the second transformer; a low-voltage die pad on which the low-voltage circuit chip is mounted; and a high-voltage die pad on which the high-voltage circuit chip is mounted, where the first transformer chip is mounted on the low-voltage die pad, and the second transformer chip is mounted on the high-voltage die pad.

[Clause A10] The gate driver according to clause A8, further including: a high-voltage circuit chip that includes the high-voltage circuit, a first transformer chip that includes the first transformer; a second transformer chip that includes the second transformer; a low-voltage die pad on which the low-voltage circuit chip is mounted; and a high-voltage die pad on which the high-voltage circuit chip is mounted, where both the first transformer chip and the second transformer chip are mounted on the low-voltage die pad or the high-voltage die pad.

[Clause A11] The gate driver according to clause A7, further including: a low-voltage circuit chip that includes the low-voltage circuit; a high-voltage circuit chip that includes the high-voltage circuit; a first transformer chip that includes the first transformer; a second transformer chip that includes the second transformer; and a capacitor chip that includes the capacitor, where the low-voltage circuit chip, the capacitor chip, the first transformer chip, the second transformer chip, and the high-voltage circuit chip are arranged in this order.

[Clause A12] The gate driver according to any one of clauses A1 to A11, where the low-voltage circuit generates a first signal for generating the drive voltage signal based on an external instruction, and the high-voltage circuit generates the drive voltage signal based on the first signal.

[Clause A13] The gate driver according to any one of clauses A1 to A12, where the capacitor includes capacitors that are connected in series.

[Clause A14] The gate driver according to any one of clauses A1 to A13, where the capacitor has an insulation voltage that is greater than or equal to 200 Vrms.

[Clause B1] An insulation module used to insulate a low-voltage circuit from a high-voltage circuit, the low-voltage circuit and the high-voltage circuit being included in a gate driver that is configured to apply a drive voltage signal to a gate of a switching element, the insulation module including: a transformer; and a capacitor connected in series to the transformer, where the low-voltage circuit and the high-voltage circuit are configured to be connected by the transformer and the capacitor, and the transformer and the capacitor are used to transmit a signal between the low-voltage circuit and the high-voltage circuit.

[Clause B2] The insulation module according to clause B1, further including: a transformer chip that includes the transformer; and a capacitor chip that includes the capacitor.

[Clause B3] The insulation module according to clause B2, further including: a first die pad on which the transformer chip is mounted; a first lead electrically connected to the transformer; a second die pad on which the capacitor chip is mounted, and a second lead electrically connected to the capacitor.

[Clause B4] The insulation module according to clause B2, further including: a common die pad on which the transformer chip and the capacitor chip are mounted; a first lead electrically connected to the transformer; and a second lead electrically connected to the capacitor.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A gate driver that is configured to apply a drive voltage signal to a gate of a switching element, the gate driver comprising:
a low-voltage circuit configured to be actuated by application of a first voltage;
a high-voltage circuit configured to be actuated by application of a second voltage that is higher than the first voltage;
a transformer;
a capacitor connected in series to the transformer;
a low-voltage circuit chip that includes the low-voltage circuit;
a high-voltage circuit chip that includes the high-voltage circuit;
a transformer chip that includes the transformer;
a capacitor chip that includes the capacitor;
a low-voltage die pad on which the low-voltage circuit chip is mounted; and
a high-voltage die pad on which the high-voltage circuit chip is mounted,
wherein the low-voltage circuit and the high-voltage circuit are connected by the transformer and the capacitor and configured to transmit a signal through the transformer and the capacitor,
the transformer chip is mounted on the low-voltage die pad or the high-voltage die pad, and
the capacitor chip is mounted on the low-voltage die pad or the high-voltage die pad.

2. The gate driver according to claim 1, wherein
the capacitor includes a first electrode and a second electrode,
the first electrode is electrically connected to the transformer, and
the second electrode is electrically connected to the high-voltage circuit.

3. The gate driver according to claim 1,
wherein the transformer chip is mounted on the low-voltage die pad.

4. The gate driver according to claim 2,
wherein the low-voltage circuit chip, the transformer chip, the capacitor chip, and the high-voltage circuit chip are arranged in this order.

5. The gate driver according to claim 4,
wherein
the transformer chip is mounted on the low-voltage die pad, and
the capacitor chip is mounted on the high-voltage die pad.

6. The gate driver according to claim 4,
wherein both the transformer chip and the capacitor chip are mounted on the low-voltage die pad or the high-voltage die pad.

7. The gate driver according to claim 1, wherein
the capacitor includes a first electrode and a second electrode,
the first electrode is electrically connected to the low-voltage circuit, and
the second electrode is electrically connected to the transformer.

8. The gate driver according to claim 7,
wherein the low-voltage circuit chip, the capacitor chip, the transformer chip, and the high-voltage circuit chip are arranged in this order.

9. The gate driver according to claim 8,
wherein both the capacitor chip and the transformer chip are mounted on the low-voltage die pad.

10. The gate driver according to claim 8,
wherein
the capacitor chip is mounted on the low-voltage die pad, and
the transformer chip is mounted on the high-voltage die pad.

11. The gate driver according to claim 1, wherein
the capacitor includes a low-voltage capacitor and a high-voltage capacitor,
the low-voltage capacitor includes a first low-voltage electrode and a second low-voltage electrode,
the first low-voltage electrode is electrically connected to the low-voltage circuit,
the second low-voltage electrode is electrically connected to the transformer,
the high-voltage capacitor includes a first high-voltage electrode and a second high-voltage electrode,
the first high-voltage electrode is electrically connected to the transformer, and
the second high-voltage electrode is electrically connected to the high-voltage circuit.

12. The gate driver according to claim 1, wherein
the capacitor includes a first capacitor and a second capacitor, the transformer includes a first transformer and a second transformer,
the first capacitor is connected in series to the first transformer,
the signal includes a first signal transmitted from the low-voltage circuit to the high-voltage circuit,
the first signal output from the low-voltage circuit is transmitted through the first transformer and the first capacitor to the high-voltage circuit,
the second capacitor is connected in series to the second transformer,
the signal includes a second signal transmitted from the high-voltage circuit to the low-voltage circuit, and
the second signal output from the high-voltage circuit is transmitted through the second transformer and the second capacitor to the low-voltage circuit.

13. The gate driver according to claim 12, wherein
each of the first capacitor and the second capacitor includes a first electrode and a second electrode,
the first electrode of the first capacitor is electrically connected to the first transformer,
the second electrode of the first capacitor is electrically connected to the high-voltage circuit,
the first electrode of the second capacitor is electrically connected to the second transformer, and
the second electrode of the second capacitor is electrically connected to the low-voltage circuit.

\* \* \* \* \*